US012080223B2

(12) United States Patent
Lee et al.

(10) Patent No.: US 12,080,223 B2
(45) Date of Patent: Sep. 3, 2024

(54) EMISSIVE DISPLAY DEVICE

(71) Applicant: Samsung Display Co., LTD., Yongin-si (KR)

(72) Inventors: Minku Lee, Asan-si (KR); Ji-Hyun Ka, Seongnam-si (KR); Chul Kyu Kang, Suwon-si (KR); Seunghee Lee, Seoul (KR); Hai-Jung In, Seoul (KR); Hyeongjun Jin, Seoul (KR); Hyun Ji Cha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/170,508

(22) Filed: Feb. 16, 2023

(65) Prior Publication Data

US 2023/0326399 A1    Oct. 12, 2023

(30) Foreign Application Priority Data

Apr. 6, 2022   (KR) .......................... 10-2022-0042925

(51) Int. Cl.
*G09G 3/32*   (2016.01)
(52) U.S. Cl.
CPC ....... *G09G 3/32* (2013.01); *G09G 2300/0842* (2013.01); *G09G 2310/0275* (2013.01)
(58) Field of Classification Search
CPC ................... G09G 3/32; G09G 3/3233; G09G 2300/0842; G09G 2300/0426; G09G 2300/0819; G09G 2300/0861; G09G 2310/0275; G09G 2310/0251; G09G 2310/0262; G09G 3/20; G09G 3/03;
(Continued)

(56) References Cited

U.S. PATENT DOCUMENTS

2016/0043159 A1*   2/2016   Kim ..................... H10K 59/126
                                                               257/71
2021/0028258 A1*   1/2021   Lee ..................... H10K 59/131
                                   (Continued)

FOREIGN PATENT DOCUMENTS

JP         2003-297655 A      10/2003
KR         10-1030003 B1       4/2011
                      (Continued)

*Primary Examiner* — Brent D Castiaux
(74) *Attorney, Agent, or Firm* — Lewis Roca Rothgerber Christie LLP

(57) ABSTRACT

An emissive display device includes: a light emitting diode; an n-type driving transistor comprising a first driving gate electrode, a first electrode receiving a driving voltage, a second electrode transferring an output current to the anode, and a second driving gate electrode; a second transistor connected to a data line; a third transistor configured to connect the first electrode and the first driving gate electrode of the driving transistor; a storage capacitor comprising a first storage electrode and a second storage electrode connected to the first driving gate electrode; a ninth transistor transferring an overlapping electrode voltage to the second driving gate electrode; an overlapping electrode voltage line crossing the data line and receiving the overlapping electrode voltage; and a shielding electrode at an intersection of the data line and the overlapping electrode voltage line and between the data line and the overlapping electrode voltage line.

20 Claims, 21 Drawing Sheets

(58) Field of Classification Search
CPC ......... G09G 3/3225; G09G 2300/0809; G09G 2320/02; G09G 2330/028; G09G 2380/02; H10K 59/131; H10K 59/126; H10K 50/805
See application file for complete search history.

(56) References Cited

U.S. PATENT DOCUMENTS

2021/0066436 A1* 3/2021 Shim ................. H10K 59/40
2021/0319747 A1* 10/2021 Jeon ................. G09G 3/3233

FOREIGN PATENT DOCUMENTS

| KR | 10-1058115 B1 | 8/2011 |
| KR | 10-2019-0104289 A | 9/2019 |
| KR | 10-2021-0062772 A | 6/2021 |
| KR | 10-2021-0113499 A | 9/2021 |

* cited by examiner

FIG. 10

|  | Oxide nTFT Pixel circuit (9T1C) ||
|  | Comparative example | Example of FIG. 8 |
| --- | --- | --- |
| LCI (Line Crosstalk Index) | 6.5 | 4.2 |
| Coupling Cap (Vdata-VINT) | 2.57f | 0.47f (82% ↓) |
| Coupling Cap (Vdata-VBML) | 2.81f | 0.36f (87% ↓) |

EMISSIVE DISPLAY DEVICE

CROSS-REFERENCE TO RELATED APPLICATION

The present application claims priority to and benefits of Korean Patent Application No. 10-2022-0042925, filed in the Korean Intellectual Property Office on Apr. 6, 2022, the entire content of which are incorporated herein by reference.

BACKGROUND

1. Field

Aspects of some embodiments of the present disclosure relate to an emissive display device.

2. Description of the Related Art

A display device displays images, and includes a liquid crystal display, an organic light emitting diode display, and the like. Such a display device is used in various electronic devices such as mobile phones, navigation units, digital cameras, electronic books, portable game machines, and various terminals.

A display device such as an organic light emitting diode display may have a structure that utilizes a flexible substrate such that the display device can be bent or folded.

A structure of a pixel used in the organic light emitting diode display is being developed in various directions.

The above information disclosed in this Background section is only for enhancement of understanding of the background and therefore the information discussed in this Background section does not necessarily constitute prior art.

SUMMARY

Aspects of some embodiments of the present disclosure relate to an emissive display device, and for example, to an emissive display device in which a driving transistor includes a pixel including an n-type transistor.

Aspects of some embodiments include an emissive display device that prevents or reduces deterioration of display quality due to coupling with a data line in a pixel in which a driving transistor is an n-type transistor.

According to some embodiments, an emissive display device includes: a light emitting diode configured to include an anode; an n-type driving transistor configured to include a first driving gate electrode, a first electrode receiving a driving voltage, a second electrode transferring an output current to the anode, and a second driving gate electrode; a second transistor configured to include a first electrode connected to a data line; a third transistor configured to connect the first electrode and the first driving gate electrode of the driving transistor; a storage capacitor configured to include a first storage electrode and a second storage electrode connected to the first driving gate electrode; a ninth transistor configured to transfer an overlapping electrode voltage to the second driving gate electrode; an overlapping electrode voltage line configured to cross the data line in a plan view and to receive the overlapping electrode voltage; and a shielding electrode positioned at an intersection of the data line and the overlapping electrode voltage line and positioned between the data line and the overlapping electrode voltage line in a cross-sectional view.

According to some embodiments, the emissive display device may further include: a fifth transistor configured to transfer the driving voltage to the first electrode of the driving transistor; and a sixth transistor configured to connect the second electrode and the anode of the driving transistor.

According to some embodiments, the emissive display device may further include a seventh transistor configured to transfer an initialization voltage to the first storage electrode and the anode.

According to some embodiments, the emissive display device may further include an initialization voltage line configured to cross the data line in a plan view and to receive the initialization voltage, wherein the shielding electrode overlaps a portion where the data line and the initialization voltage line intersect, and the shielding electrode is positioned between the data line and the initialization voltage line in a cross-sectional view.

According to some embodiments, the emissive display device may further include an eighth transistor configured to connect the anode and the second driving gate electrode.

According to some embodiments, the fifth transistor, the sixth transistor, and the eighth transistor may be controlled by a same emission signal.

According to some embodiments, the emissive display device may further include a fourth transistor configured to transfer a reference voltage to the first driving gate electrode.

According to some embodiments, the driving voltage may be transferred to the shielding electrode.

According to some embodiments, an emissive display device includes: a light emitting diode configured to include an anode; an n-type driving transistor configured to include a first driving gate electrode, a first electrode receiving a driving voltage, a second electrode transferring an output current to the anode, and a second driving gate electrode; a second transistor configured to include a first electrode connected to a data line; a third transistor configured to connect the first electrode and the first driving gate electrode of the driving transistor; a storage capacitor configured to include a first storage electrode and a second storage electrode connected to the first driving gate electrode; a seventh transistor configured to transfer an initialization voltage to the first storage electrode; a ninth transistor configured to transfer an overlapping electrode voltage to the second driving gate electrode; an initialization voltage line configured to cross the data line in a plan view and to receive the initialization voltage; and a shielding electrode positioned at an intersection of the data line and the initialization voltage line and positioned between the data line and the initialization voltage line in a cross-sectional view.

According to some embodiments, the emissive display device may further include: a fifth transistor configured to transfer the driving voltage to the first electrode of the driving transistor; and a sixth transistor configured to connect the second electrode and the anode of the driving transistor.

According to some embodiments, the emissive display device may further include an eighth transistor configured to connect the anode and the second driving gate electrode, and the fifth transistor, the sixth transistor, and the eighth transistor may be controlled by a same emission signal.

According to some embodiments, the emissive display device may further include a fourth transistor configured to transfer a reference voltage to the first driving gate electrode.

According to some embodiments, the driving voltage may be transferred to the shielding electrode.

According to some embodiments, an emissive display device includes: a light emitting diode configured to include an anode; an n-type driving transistor configured to include a first driving gate electrode, a first electrode receiving a driving voltage, a second electrode transferring an output current to the anode, and a second driving gate electrode; a second transistor configured to include a first electrode connected to a data line; a storage capacitor configured to include a first storage electrode and a second storage electrode connected to the first driving gate electrode; a hold capacitor configured to include a first electrode receiving the driving voltage and a second electrode connected to the second driving gate electrode; a fourth transistor configured to transfer an initialization voltage to the first storage electrode, the anode, the second driving gate electrode, and the second electrode of the hold capacitor; an initialization voltage line configured to cross the data line in a plan view and to receive the initialization voltage; and a shielding electrode positioned at an intersection of the data line and the initialization voltage line and positioned between the data line and the initialization voltage line in a cross-sectional view.

According to some embodiments, the driving voltage may be transferred to the shielding electrode.

According to some embodiments, the emissive display device may further include a driving voltage line configured to transfer the driving voltage, the driving voltage line includes a protruding portion, and the protruding portion serves as a first electrode of the hold capacitor.

According to some embodiments, the emissive display device may further include a capacitor electrode positioned below the first electrode of the hold capacitor, and the capacitor electrode may function as the second electrode of the hold capacitor and the first storage electrode.

According to some embodiments, the second storage electrode may overlap the capacitor electrode in a plan view, and may be positioned under the capacitor electrode.

According to some embodiments, the emissive display device may further include a third transistor configured to transfer a reference voltage to the first driving gate electrode and the second storage electrode.

According to some embodiments, the emissive display device may further include a fifth transistor configured to transfer the driving voltage to the first electrode of the driving transistor.

According to some embodiments, it may be possible to provide an emissive display device in which display quality is not deteriorated by shielding a coupling between a data line and a voltage line in a pixel in which a driving transistor is an n-type transistor.

BRIEF DESCRIPTION OF THE DRAWINGS

FIG. 10 illustrates a table comparing specific values for a comparative example and some embodiments.

DETAILED DESCRIPTION

Figure 1:
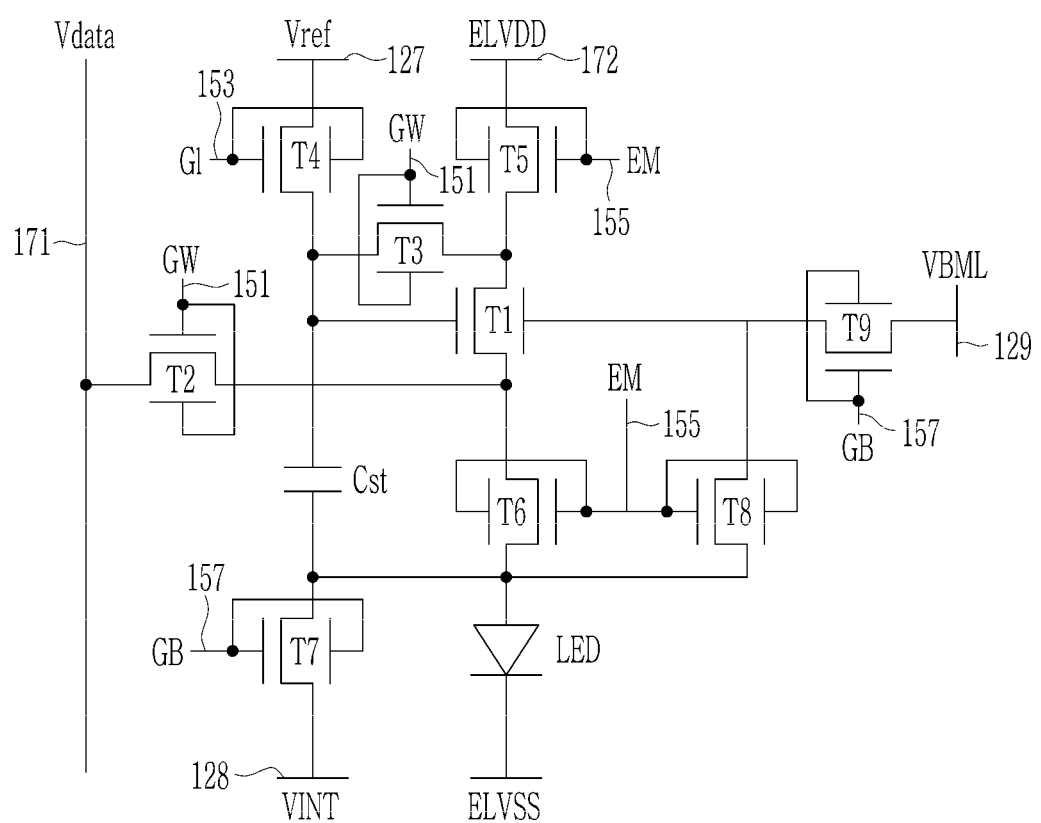
FIG. 1 illustrates an equivalent circuit diagram of a pixel included in an emissive display device according to some embodiments.

Aspects of some embodiments of the present invention will be described more fully hereinafter with reference to the accompanying drawings, in which some embodiments of the invention are shown. As those skilled in the art would realize, the described embodiments may be modified in various different ways, all without departing from the spirit or scope of the present invention.

To more clearly describe the present invention, parts that are irrelevant to enabling a person having ordinary skill in the art to make and use the invention may be omitted, and like numerals refer to like or similar constituent elements throughout the specification.

Further, because sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure.

In addition, an electronic device (e.g., a mobile phone, TV, monitor, notebook computer, etc.) including a display device, a display panel, etc. described in the specification, or an electronic device including a display device and a display panel manufactured by the manufacturing method described in the specification, are not excluded from the scope of the present specification.

First, a circuit structure of a pixel including an n-type transistor as a driving transistor will be described with reference to FIG. 1.

FIG. 1 illustrates an equivalent circuit diagram of a pixel included in an emissive display device according to some embodiments.

One pixel according to FIG. 1 includes a plurality of transistors T1, T2, T3, T4, T5, T6, T7, T8, and T9, a storage capacitor Cst, and a light emitting diode LED, which are connected to wires 127, 128, 129, 151, 153, 155, 157, 171, and 172. Herein, the transistors and the capacitor excluding the light emitting diode LED may constitute a pixel circuit unit, and one pixel may include the pixel circuit unit and the light emitting diode. In the embodiments illustrated with respect to FIG. 1, the transistors T1, T2, T3, T4, T5, T6, T7, T8, and T9 may all be classified as n-type transistors. According to some embodiments, the n-type transistor may be formed as an oxide semiconductor transistor including an oxide semiconductor. The n-type transistor may be a transistor that is turned on when a relatively high voltage of a gate electrode is applied.

The wires 127, 128, 129, 151, 153, 155, 157, 171, and 172 are connected to one pixel PX. The wires include a reference voltage line 127, an initialization voltage line 128, an overlapping electrode voltage line 129, a first scan line 151, a first control line 153, an emission control line 155, a second control line 157, a data line 171, and a driving voltage line 172. Additionally, a common voltage line transferring a driving low voltage ELVSS may be connected to one side of the light emitting diode LED.

The first scan line 151 transfers a first scan signal GW to the second transistor T2 and the third transistor T3. The first control line 153 transfers a first control signal GI to the fourth transistor T4, the light emission control line 155 transfers a light emission signal EM to the fifth transistor T5, the sixth transistor T6, and the eighth transistor T8, and the second control line 157 transfers a second control signal GB to the seventh transistor T7 and the ninth transistor T9.

The data line 171 is a line that transfers the data voltage Vdata generated by the data driver, and accordingly, a magnitude of the emission current transferred to the light emitting diode LED is changed, so that luminance of the light emitting diode LED is also changed. The driving voltage line 172 applies a driving voltage ELVDD. The reference voltage line 127 transfers a reference voltage Vref, and the initialization voltage line 128 transfers an initialization voltage VINT. The overlapping electrode voltage line 129 transfers an overlapping electrode voltage VBML applied to an overlapping electrode (hereinafter also referred to as a second driving gate electrode) overlapping a channel of the driving transistor T1. According to some embodiments, the voltages applied to the driving voltage line 172, the reference voltage line 127, the initialization voltage line 128, and the overlapping electrode voltage line 129 may each be a constant voltage.

The driving transistor T1 (also referred to as first transistor) is an n-type transistor and includes an oxide semiconductor as a semiconductor layer. It is a transistor that adjusts a magnitude of an emission current that is outputted to one electrode (anode) of the light emitting diode LED depending on a magnitude of a voltage (i.e., a voltage stored in the storage capacitor Cst) of the gate electrode (hereinafter also referred to as a driving gate electrode or a first driving gate electrode) of the driving transistor T1.

Brightness of the light emitting diode LED may be adjusted according to the magnitude of the emission current output to one electrode of the light emitting diode LED, and thus emission luminance of the light emitting diode LED may be adjusted according to a data voltage Vdata applied to the pixel. For this purpose, a first electrode of the driving transistor T1 is connected to the driving voltage line 172 via the fifth transistor T5 by being positioned to receive the driving voltage ELVDD. In addition, the first electrode of the driving transistor T1 is also connected to a second electrode of the third transistor T3.

Meanwhile, the second electrode of the driving transistor T1 outputs an emission current to the light emitting diode LED, and is connected to one electrode of the light emitting diode LED via the sixth transistor T6 (hereinafter also referred to as an output control transistor). The data voltage Vdata is applied to the second electrode of the driving transistor T1 through the second transistor T2. Meanwhile, a gate electrode of the driving transistor T1 is connected to a first electrode (hereinafter referred to as a second storage electrode) of the storage capacitor Cst. Accordingly, the voltage of the gate electrode of the driving transistor T1 changes depending on a voltage stored in the storage capacitor Cst, and an emission current outputted by the driving transistor T1 changes accordingly. The storage capacitor Cst serves to maintain a voltage of the gate electrode of the driving transistor T1 to be constant during one frame. Meanwhile, a gate electrode of the driving transistor T1 may also be connected to the fourth transistor T4, to be initialized by receiving the reference voltage Vref. Additionally, the driving transistor T1 may further include an overlapping electrode (hereinafter also referred to as a second driving gate electrode) overlapping a channel provided in the semiconductor layer, and the overlapping electrode may receive the overlapping electrode voltage VBML through the ninth transistor T9.

The second transistor T2, which is an n-type transistor, has an oxide semiconductor as a semiconductor layer. The second transistor T2 is a transistor that receives the data voltage Vdata into the pixel. A gate electrode of the second transistor T2 may be connected to the first scan line 151. A first electrode of the second transistor T2 is connected to the data line 171. A second electrode of the second transistor T2 is connected to the second electrode of the driving transistor T1 and the first electrode of the sixth transistor T6. When the second transistor T2 is turned on by the positive voltage of the first scan signal GW transferred through the first scan line 151, the data voltage Vdata transferred through the data line 171 is transferred to the second electrode of the driving transistor T1, and the data voltage Vdata is transferred to the gate electrode of the driving transistor T1 and the second storage electrode of the storage capacitor Cst through the first electrode of the driving transistor T1 and the third transistor T3.

The third transistor T3, which is an n-type transistor, has an oxide semiconductor as a semiconductor layer. The third transistor T3 electrically connects the first electrode of the driving transistor T1 and the driving gate electrode of the driving transistor T1. As a result, the third transistor T3 allows the data voltage Vdata to pass through the driving transistor T1 to the driving gate electrode. A gate electrode of the third transistor T3 is connected to the first scan line 151, and a first electrode of the third transistor T3 is connected to the first electrode of the driving transistor T1 and a second electrode of the fifth transistor T5. The second electrode of the third transistor T3 is connected to the driving gate electrode of the driving transistor T1, the second electrode of the fourth transistor T4, and the second storage electrode of the storage capacitor Cst. The third transistor T3 is turned on by a positive voltage of the first scan signal GW transferred through the scan line 151, so as to connect the first electrode of the driving transistor T1 and the second electrode of the second transistor T1.

The fourth transistor T4, which is an n-type transistor, has an oxide semiconductor as a semiconductor layer. The fourth transistor T4 serves to transfer the reference voltage Vref to the gate electrode of the driving transistor T1 and the second storage electrode of the storage capacitor Cst. A gate electrode of the fourth transistor T4 is connected to the first control line 153, and a first electrode of the fourth transistor T4 is connected to the reference voltage line 127. A second electrode of the fourth transistor T4 is connected to the second storage electrode of the storage capacitor Cst and the gate electrode of the driving transistor T1. The fourth transistor T4 is turned on by a positive voltage of the first control signal GI transferred through the first control line 153, and in this case, the reference voltage Vref is transferred to the gate electrode of the driving transistor T1 and the second storage electrode of the storage capacitor Cst.

The fifth transistor T5 and the sixth transistor T6, which are n-type transistors, have an oxide semiconductor as a semiconductor layer.

The fifth transistor T5 serves to transfer the driving voltage ELVDD to the driving transistor T1. A gate electrode of the fifth transistor T5 is connected to the emission control line 155, a first electrode of the fifth transistor T5 is connected to the driving voltage line 172, and a second electrode of the fifth transistor T5 is connected to the first electrode of the driving transistor T1 and the first electrode of the third transistor T3.

The sixth transistor T6 serves to transfer an emission current outputted from the driving transistor T1 to the light emitting diode. A gate electrode of the sixth transistor T6 is connected to the emission control line 155, a first electrode of the sixth transistor T6 is connected to the second electrode of the driving transistor T1 and the second electrode of the second transistor T2, and a second electrode of the sixth transistor T6 is connected to one electrode of the light emitting diode LED, a second electrode of the seventh transistor T7, and a second electrode of the eighth transistor T8.

The seventh transistor T7, which is an n-type transistor, has an oxide semiconductor as a semiconductor layer. The seventh transistor T7 serves to initialize an electrode of the light emitting diode LED. Hereinafter, the seventh transistor T7 is also referred to as a light emitting diode initialization transistor. A gate electrode of the seventh transistor T7 is connected to the second control line 157, the second electrode of the seventh transistor T7 is connected to one electrode of the light emitting diode LED, the second electrode of the sixth transistor T6, the second electrode of the eighth transistor T8, and the first electrode of the storage capacitor Cst (hereinafter also referred to as first storage electrode), and a first electrode of the seventh transistor T7 is connected to the initialization voltage line 128. When the seventh transistor T7 is turned on by a positive voltage of the second control signal GB flowing through the second control line 157, the initialization voltage VINT is applied to one electrode of the light emitting diode LED to be initialized.

The eighth transistor T8 serves to transfer the overlapping electrode voltage VBML to one electrode of the light emitting diode LED and the first storage electrode of the storage capacitor Cst. A gate electrode of the eighth transistor T8 is connected to the emission control line 155, a first electrode of the eighth transistor T8 is connected to an overlapping electrode of the driving transistor T1 and a second electrode of the ninth transistor T9, and a second electrode of the eighth transistor T8 is connected to one electrode of the light emitting diode LED, the first storage electrode of the storage capacitor Cst, the second electrode of the sixth transistor T6, and the second electrode of the seventh transistor T7.

The ninth transistor T9 serves to transfer the overlapping electrode voltage VBML to the overlapping electrode of the driving transistor T1. A gate electrode of the ninth transistor T9 is connected to the second control line 157, the second electrode of the ninth transistor T9 is connected to the overlapping electrode of the driving transistor T1 and the first electrode of the eighth transistor T8, and a first electrode of the ninth transistor T9 is connected to the overlapping electrode voltage line 129. When the ninth transistor T9 is turned on by the positive voltage of the second control signal GB flowing through the second control line 157, the overlapping electrode voltage VBML is applied to the overlapping electrode of the driving transistor T1.

Referring to FIG. 1, all the transistors T1, T2, T3, T4, T5, T6, T7, T8, and T9 including the driving transistor T1 have an overlapping electrode overlapping a channel included in a semiconductor layer. In this case, in all the transistors T2, T3, T4, T5, T6, T7, T8, and T9 except the driving transistor T1, each overlapping electrode is electrically connected to each gate electrode, and each overlapping electrode may serve as another gate electrode (hereinafter also referred to as second gate electrode).

In the above description, all the transistors T1, T2, T3, T4, T5, T6, T7, T8, and T9 are formed as n-type transistors and an oxide semiconductor is used for the semiconductor layer, but some embodiments may be n-type transistors without an oxide semiconductor, and a silicon semiconductor may also be used for the semiconductor layer.

The first storage electrode of the storage capacitor Cst is connected to the second electrode of the seventh transistor T7, the second electrode of the sixth transistor T6, the second electrode of the eighth transistor T8, and one electrode of the light emitting diode LED, and the second storage electrode is connected to the gate electrode of the driving transistor T1, the second electrode of the third transistor T3, and the second electrode of the fourth transistor T4.

Although it has been described that one pixel PX includes nine transistors T1 to T9 and one capacitor (storage capacitor Cst), embodiments according to the present invention are not limited thereto.

In the above, a circuit structure of a pixel according to some embodiments has been described with reference to FIG. 1.

Hereinafter, a waveform of a signal applied to the pixel of FIG. 1 and an operation of the pixel depending on the waveform will be described with reference to FIG. 2.

Figure 2:
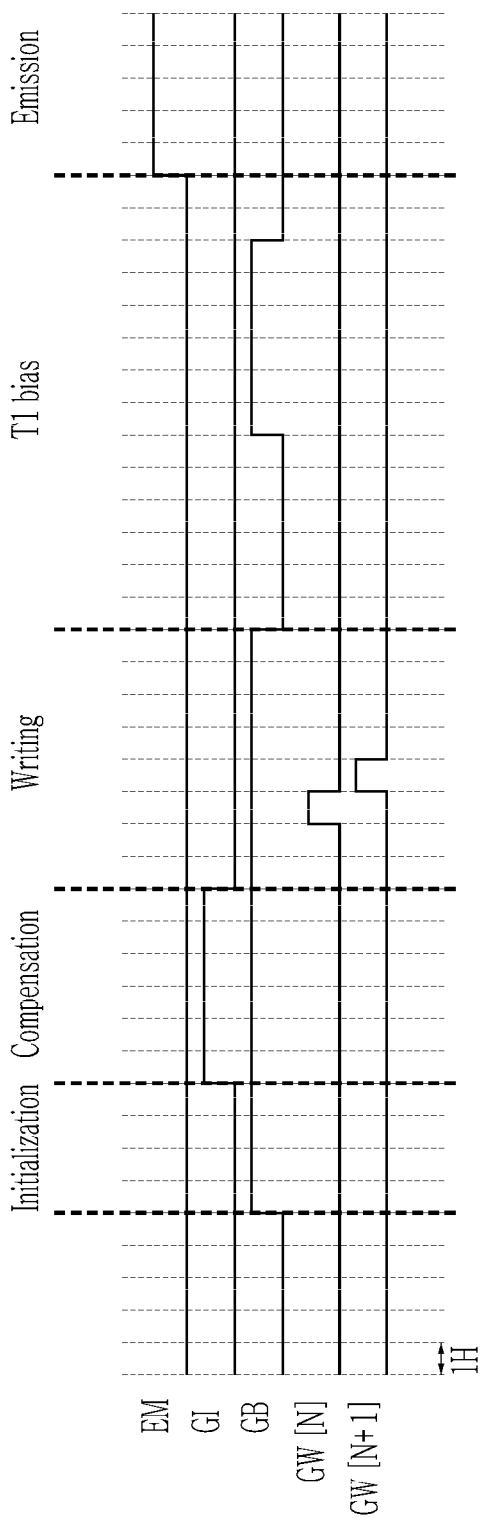
FIG. 2 illustrates a waveform diagram showing a signal applied to the pixel of FIG. 1.

FIG. 2 illustrates a waveform diagram showing a signal applied to the pixel of FIG. 1.

Referring to FIG. 2, when a signal applied to a pixel is divided into periods, it may be divided into an initialization period, a compensation period, a writing period, and an emission period, and additionally, a T1 bias period may be further included between the writing period and the emission period. Herein, the T1 bias period may help the driving transistor T1 to perform a same operation by maintaining a voltage relationship of the respective electrodes of the driving transistor T1 to not change even when a data voltage is not transmitted during the writing period, and may enable the emissive display device to perform various driving methods such as low-power driving or high-speed driving. Meanwhile, a gate-on voltage and a gate-off voltage may be a high or low voltage depending on a type of transistor to which they are applied, and in the n-type transistor, the high voltage may be the gate-on voltage and the low voltage may be the gate-off voltage.

First, the emission period is a period during which the light emitting diode LED emits light, and the gate-on voltage is applied to an emission signal EM to turn on the fifth transistor T5 and the sixth transistor T6. When the fifth transistor T5 is turned on so that the driving voltage ELVDD is transferred to the driving transistor T1, an output current is generated depending on a voltage of a gate electrode of the driving transistor T1. The output current of the driving transistor T1 is transmitted to the light emitting diode LED through the turned-on sixth transistor T6, to enable the light emitting diode LED to emit light. In addition, during the emission period, the eighth transistor T8 is also turned on by receiving the emission signal EM, and the overlapping electrode (second driving gate electrode) of the driving transistor T1 and one electrode (anode) of the light emitting diode LED are connected.

In this case, the sixth transistor T6 is turned on, and thus has substantially a same voltage between one electrode (anode) of the light emitting diode LED and the second electrode of the driving transistor T1, and in this case, the overlapping electrode (second driving gate electrode) of the driving transistor T1 also has the same voltage so that a channel characteristic of the driving transistor T1 is maintained without being changed. In FIG. 2, the emission period during which the emission signal EM applies a gate-on voltage is hardly illustrated, but in reality, the emission period has a longest time. However, the emission period is simply illustrated in FIG. 2 without specific explanation because only the above simple operation is performed.

When the emission period ends, the initialization period is entered.

As the emission signal EM is changed to the gate-off voltage, the emission period ends. Thereafter, as the second control signal GB is changed to the gate-on voltage, it enters the initialization period, and in this case, the light emission signal EM, the first control signal GI, and the first scan signal GW maintain the gate-off voltage.

During the initialization period, the seventh transistor T7 and the ninth transistor T9 to which the second control signal GB is applied are turned on. The initialization voltage VINT is transmitted to one electrode (anode) of the light emitting diode LED and the first storage electrode of the storage capacitor Cst by the turned-on seventh transistor T7. In addition, the overlapping electrode (second driving gate electrode) of the driving transistor T1 is transferred to the overlapping electrode voltage VBML by the turned-on ninth transistor T9 to be initialized.

Thereafter, as the first control signal GI is changed to the gate-on voltage, the compensation period is entered. In this case, the emission signal EM and the first scan signal GW maintain the gate-off voltage, and the second control signal GB maintains the gate-on voltage.

The fourth transistor T4 is turned on by the first control signal GI to transfer the reference voltage Vref to the driving gate electrode of the driving transistor T1 and the second storage electrode of the storage capacitor Cst. The reference voltage Vref has a high-level voltage value capable of turning on the driving transistor T1, and thus the driving transistor T1 may have a turned-on state during the compensation period. In addition, during the compensation period, the first storage electrode of the storage capacitor Cst has the initialization voltage VINT, and the second storage electrode of the storage capacitor Cst has the reference voltage Vref.

Thereafter, as the first control signal GI is changed to the gate-off voltage, the compensation period ends and the writing period is entered. During the writing period, the first scan signal GW may be applied as the gate-on voltage for 1 H, and the gate-on voltage may be sequentially applied to the first scan line 151 of each row of the first scan signal GW.

The second transistor T2 and the third transistor T3 are turned on by the gate-on voltage of the first scan signal GW, the data voltage Vdata is transferred to the second electrode of the driving transistor T1 by the turned-on second transistor T2, and the first electrode of the driving transistor T1 and the driving gate electrode are electrically connected by the turned-on third transistor T3. In this case, the driving gate electrode of the driving transistor T1 is the same as the voltage of the second storage electrode of the storage capacitor Cst and has the reference voltage Vref, and thus the driving transistor T1 is turned on.

Accordingly, the second electrode of the driving transistor T1 is connected to the driving gate electrode of the driving transistor T1 by the turned on driving transistor T1 and the turned on third transistor T3. The reference voltage Vref may have a higher voltage value than the data voltage Vdata, and when the voltage value charged in the second storage electrode of the storage capacitor Cst gradually decreases and is higher than the voltage of the second electrode of the driving transistor T1 by the threshold voltage Vth of the driving transistor T1, the driving transistor T1 is turned on, and a voltage value of the driving gate electrode at that time is stored in the second storage electrode of the storage capacitor Cst. Therefore, the voltage value of the driving gate electrode (i.e., second storage electrode) after the writing period is ended may be expressed by Equation 1 below.

$$\text{Voltage of driving gate electrode} = V\text{data} + Vth \quad \text{Equation 1}$$

The threshold voltage Vth of the voltage of the driving gate electrode of Equation 1 is used to turn on the driving transistor T1, and the remaining voltage, which is the data voltage Vdata, is used by the driving transistor T1 to generate an output current.

Referring to FIG. 2, after the writing period ends, the T1 bias period may proceed, and during the T1 bias period, the second control signal GB is changed to the gate-off voltage and then changed to the gate-on voltage at least once and then changed to the gate-off voltage again.

When the second control signal GB is applied once to the high level voltage, a voltage of the overlapping electrode (second driving gate electrode) of the driving transistor T1 is changed to the overlapping electrode voltage VBML. As a result, even when the voltage of the overlapping electrode (second driving gate electrode) of the driving transistor T1 is lowered due to a leakage current or the like, the voltage may be enabled to be increased again, and voltages of the other electrodes (the driving gate electrode, the first electrode, and the second electrode) of the driving transistor T1 may also be enabled to be increased to prevent or reduce variations in characteristics of the driving transistor T1.

In addition, the driving transistor T1 is turned on by the reference voltage Vref to serve to maintain a constant output current to be generated by preventing or reducing instances of the characteristic of the driving transistor T1 from being shifted in a negative direction due to the applied high-level overlapping electrode voltage VBML. The high-level overlap electrode voltage VBML may have a voltage value of 1 V or more and 5 V or less, it may have a voltage value of about 2.3 V according to some embodiments, and a voltage of 1 V or more and 5 V or less may be selected and applied depending on the characteristic of the driving transistor T1 included in the display device.

In addition, during the T1 bias period, even when the data voltage Vdata is not applied in the writing period, even when the data voltage Vdata applied to the existing frame is lowered, it may be raised again to keep an output current of the driving transistor T1 constant during the emission period. As a result, various driving methods such as low-power driving or high-speed driving of the emissive display device may be enabled.

According to some embodiments, the T1 bias period may be omitted in a driving method of the pixel. In addition, the driving method of the pixel according to some embodiments may include a first driving method in which the T1 bias period is included and a second driving method in which the T1 bias period is not included, the first driving method may be operated during some periods, and the second driving method may be operated during remaining periods.

In FIG. 2, as the emission signal EM is changed to a gate-on voltage, the emission period is entered.

During the emission period, the gate-on voltage of the emission signal EM is applied to turn on the fifth transistor T5 and the sixth transistor T6. As a result, when the fifth transistor T5 is turned on so that the driving voltage ELVDD is transferred to the driving transistor T1, an output current is generated depending on the voltage (i.e., data voltage Vdata) of the gate electrode of the driving transistor T1. The output current of the driving transistor T1 is transmitted to the light emitting diode LED through the turned-on sixth transistor T6, to enable the light emitting diode LED to emit light. In this case, the eighth transistor T8 is also turned on by the light emitting signal EM, and the overlapping electrode (second driving gate electrode) of the driving transistor T1 and one electrode (anode) of the light emitting diode LED are connected.

In addition, because the sixth transistor T6 is also turned on, the overlapping electrode (second driving gate electrode) of the driving transistor T1 is also connected to the second electrode of the driving transistor T1. In the eighth transistor, the overlapping electrode (the second driving gate electrode) of the driving transistor T1 also has a constant voltage during the emission period, so that a channel characteristic of the driving transistor T1 is maintained without being changed.

In the above, the circuit structure and operation of the pixel have been described with reference to FIG. 1 and FIG. 2.

Hereinafter, a stacked structure of a pixel will be described in more detail with reference to FIG. 3 to FIG. 9.

A planar structure of a pixel circuit unit in a pixel according to some embodiments will be described in more detail with reference to FIG. 3 to FIG. 8. That is, the light emitting diode LED is not illustrated in FIG. 3 to FIG. 8 below, but the structure of the pixel circuit unit positioned below the light emitting diode LED will be described.

FIG. 3 to FIG. 8 illustrate top plan views of each layer depending on a manufacturing procedure of the emissive display device according to the embodiments shown with respect to FIG. 1.

Figure 3:
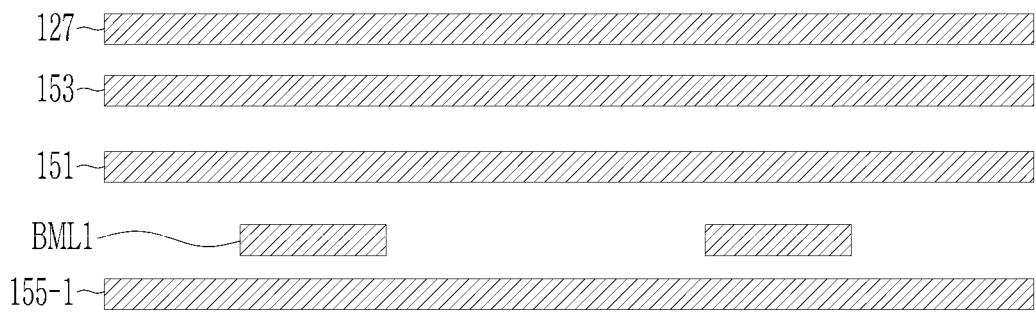
FIG. 3 to FIG. 8 illustrate top plan views of each layer depending on a manufacturing procedure of the emissive display device according to the embodiments shown with respect to FIG. 1.
Figure 3:
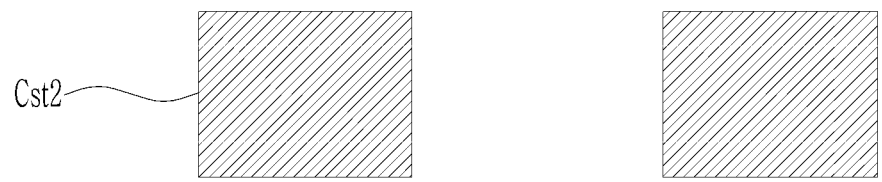
Figure 3:
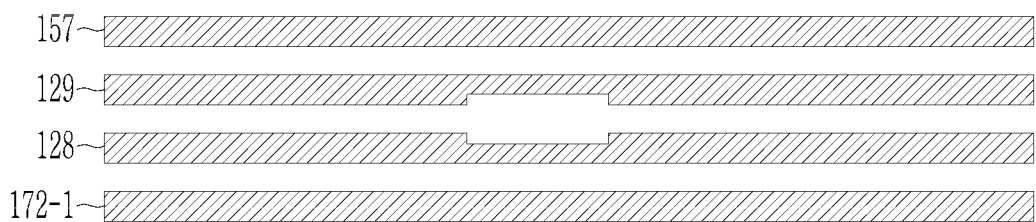
Figure 3:
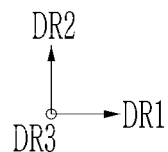

Referring to FIG. 3, a first conductive layer is positioned on the substrate 110, a first conductive layer includes a reference voltage line 127, a first control line 153, a first scan line 151, an additional emission control line 155-1, a second control line 157, an overlapping electrode voltage line 129, an initialization voltage line 128, and an additional driving voltage line 172-1 extending in the first direction DR1, and also includes an overlapping electrode BML1 having an island-like structure and a second storage electrode Cst2.

Figure 9:
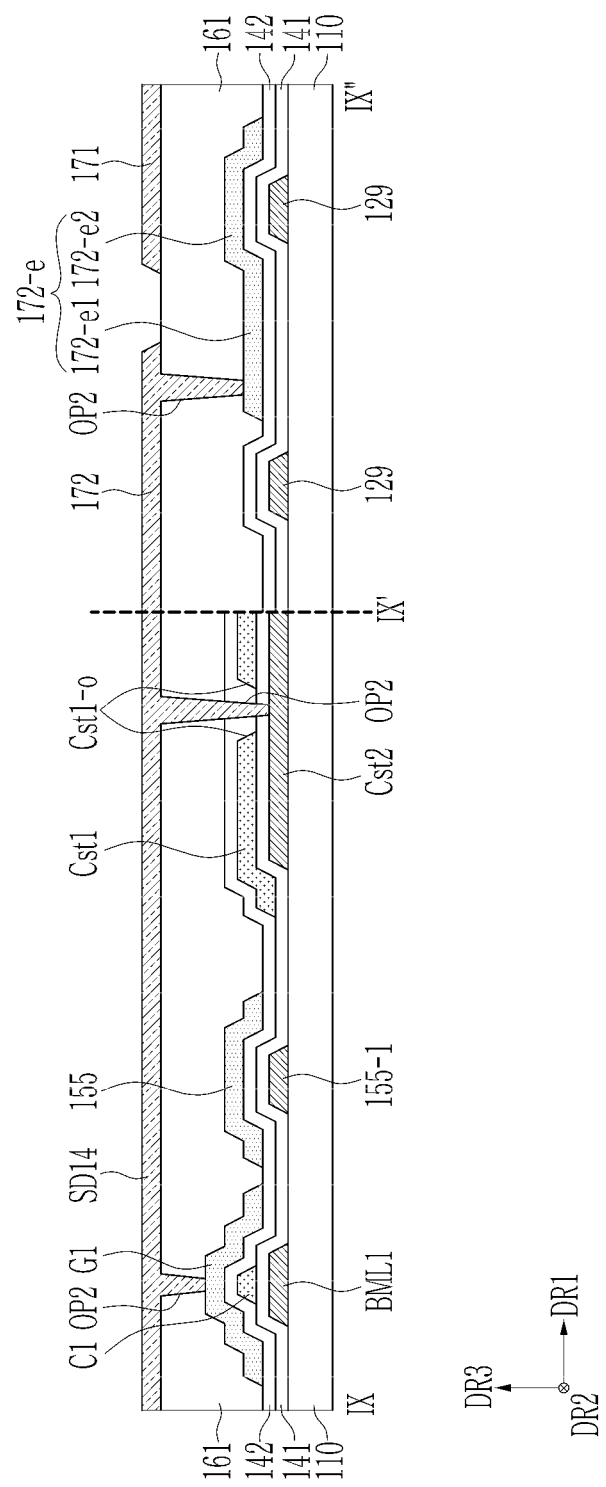
FIG. 9 illustrates a cross-sectional view of an emissive display device taken along the sectional lines IX-IX' and IX'-IX" of FIG. 8.

In FIG. 9, the substrate 110 may include a material that has a rigid property such as glass so as to not bend, or may include a flexible material that can be bent, such as plastic or a polyimide. In the case of a flexible substrate, it may be to have a structure in which a two-layer structure of a polyimide and a barrier layer formed of an inorganic insulating material thereon is doubly formed.

The first conductive layer may include following voltage lines extending in the first direction DR1.

The reference voltage line 127 transfers the reference voltage Vref in the first direction DR1, the first control line 153 transmits the first control signal GI in the first direction DR1, the first scan line 151 transmits the first scan signal GW in the first direction DR1, the additional light emission control line 155-1 transmits the emission signal EM in the first direction DR1, the second control line 157 transmits the second control signal GB in the first direction DR1, the overlapping electrode voltage line 129 transfers the overlapping electrode voltage VBML in the first direction DR1, the initialization voltage line 128 transfers the initialization voltage VINT in the first direction DR1, and the additional driving voltage line 172-1 transfers the driving voltage ELVDD in the first direction DR1.

In addition, the first conductive layer includes a second storage electrode Cst2 and an overlapping electrode BML1 having an island-like structure. The overlapping electrode BML1 may also serve as the second gate electrode of the driving transistor T1, and may overlap the channel and the driving gate electrode of the driving transistor T1 to be subsequently formed in a plan view.

The first conductive layer may include a metal such as copper (Cu), molybdenum (Mo), aluminum (Al), titanium (Ti), or a metal alloy thereof, and may be configured as a single layer or multiple layers.

Referring to FIG. 9, a first insulating layer 141 is covered on the substrate 110 and the first conductive layer. The first insulating layer 141 may include an inorganic insulating layer including a silicon oxide (SiOx), a silicon nitride (SiNx), a silicon oxynitride ($SiO_xN_y$), or the like.

Figure 4:
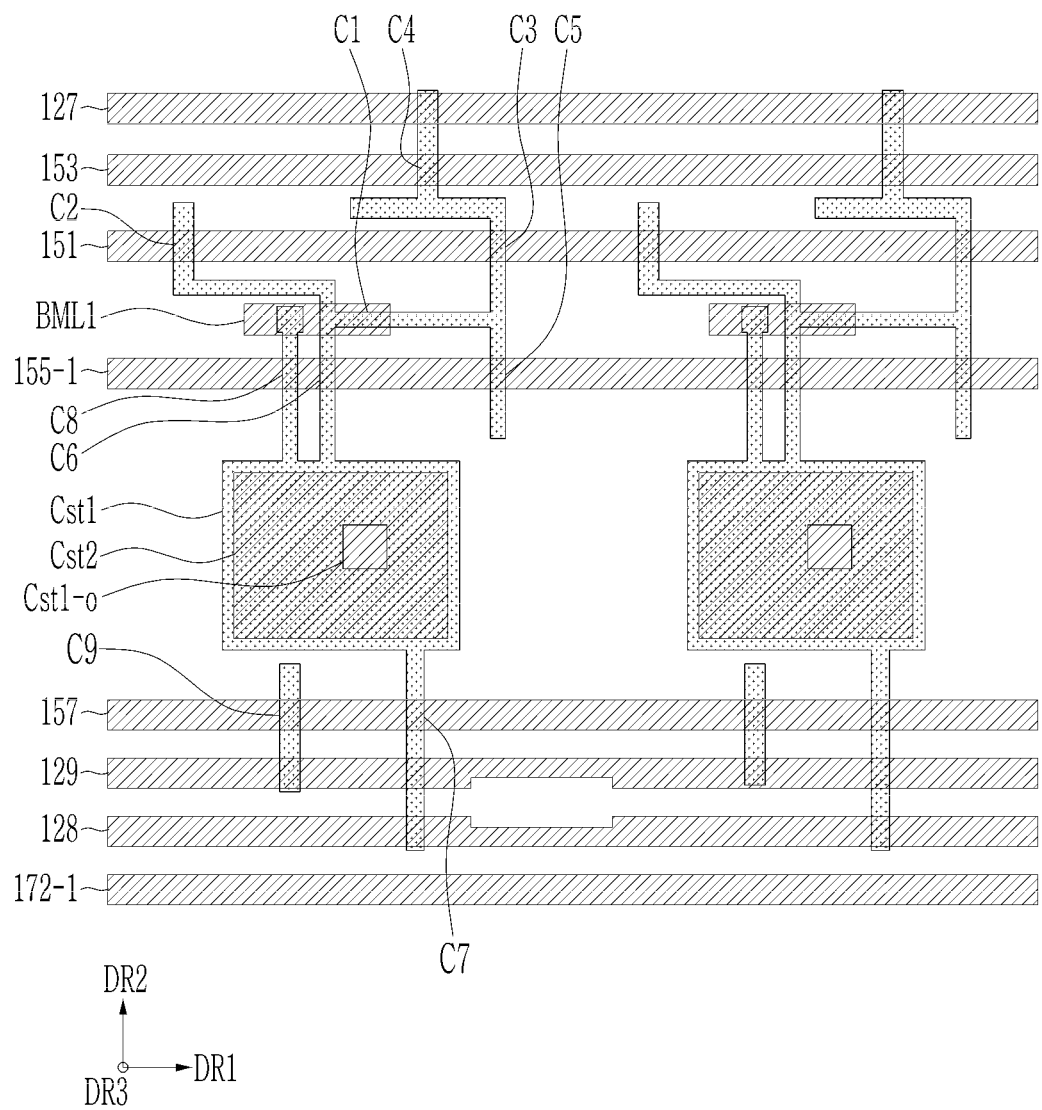

Referring to FIG. 4, a semiconductor layer is positioned on the first insulating layer 141, and the semiconductor layer includes a first storage electrode Cst1, a first semiconductor C1, a second semiconductor C2, a third semiconductor C3, a fourth semiconductor C4, a fifth semiconductor C5, a sixth semiconductor C6, a seventh semiconductor C7, and an eighth semiconductor C8 extending vertically from the first storage electrode Cst1, and additionally includes a separately isolated ninth semiconductor C9. The semiconductor layer may be formed of an oxide semiconductor.

The first storage electrode Cst1 includes an opening Cst1-o, the seventh semiconductor C7 extends in a direction that is opposite to the second direction DR2, and the seventh semiconductor C7 extends to the initialization voltage line 128 through the second control line 157 and the overlapping electrode voltage line 129.

In the first storage electrode Cst1, the sixth semiconductor C6, and the eighth semiconductor C8 extend in the second direction DR2. The eighth semiconductor C8 extends through the additional emission control line 155-1 to the overlapping electrode BML1. The sixth semiconductor C6 also extends to the overlapping electrode BML1 through the additional emission control line 155-1, and includes a second semiconductor C2 and a first semiconductor C1 that are separated to opposite sides on the overlapping electrode BML1 in a plan view. The second semiconductor C2 includes a structure that crosses the first scan line 151 in the second direction DR2, has a planar portion that overlaps the first scan line 151, and is positioned until it passes through the first scan line 151. The first semiconductor C1 overlaps the overlapping electrode BML1 in a plan view, extends in the first direction DR1, and is connected to the fifth semiconductor C5 and the third semiconductor C3. The fifth semiconductor C5 has a structure that extends in a direction that is opposite to the second direction DR2 to cross the additional emission control line 155-1. The third semiconductor C3 has a structure that crosses the first scan line 151 and is bent in a direction that is opposite to the first direction DR1 through the first scan line 151. The third semiconductor C3 is connected to the fourth semiconductor C4 that protrudes in the second direction DR2. The fourth semiconductor C4 extends through the first control line 153 to the reference voltage line 127.

Meanwhile, the ninth semiconductor C9 has a structure that extends in the second direction DR2 and overlaps the second control line 157 and the overlapping electrode voltage line 129 in a plan view.

Referring to FIG. 9, the second insulating layer 142 is covered on the first insulating layer 141 and the semiconductor layer. The second insulating layer 142 may include an inorganic insulating layer including a silicon oxide (SiO$_x$), a silicon nitride (SiN$_x$), a silicon oxynitride (SiO$_x$N$_y$), or the like.

Figure 5:
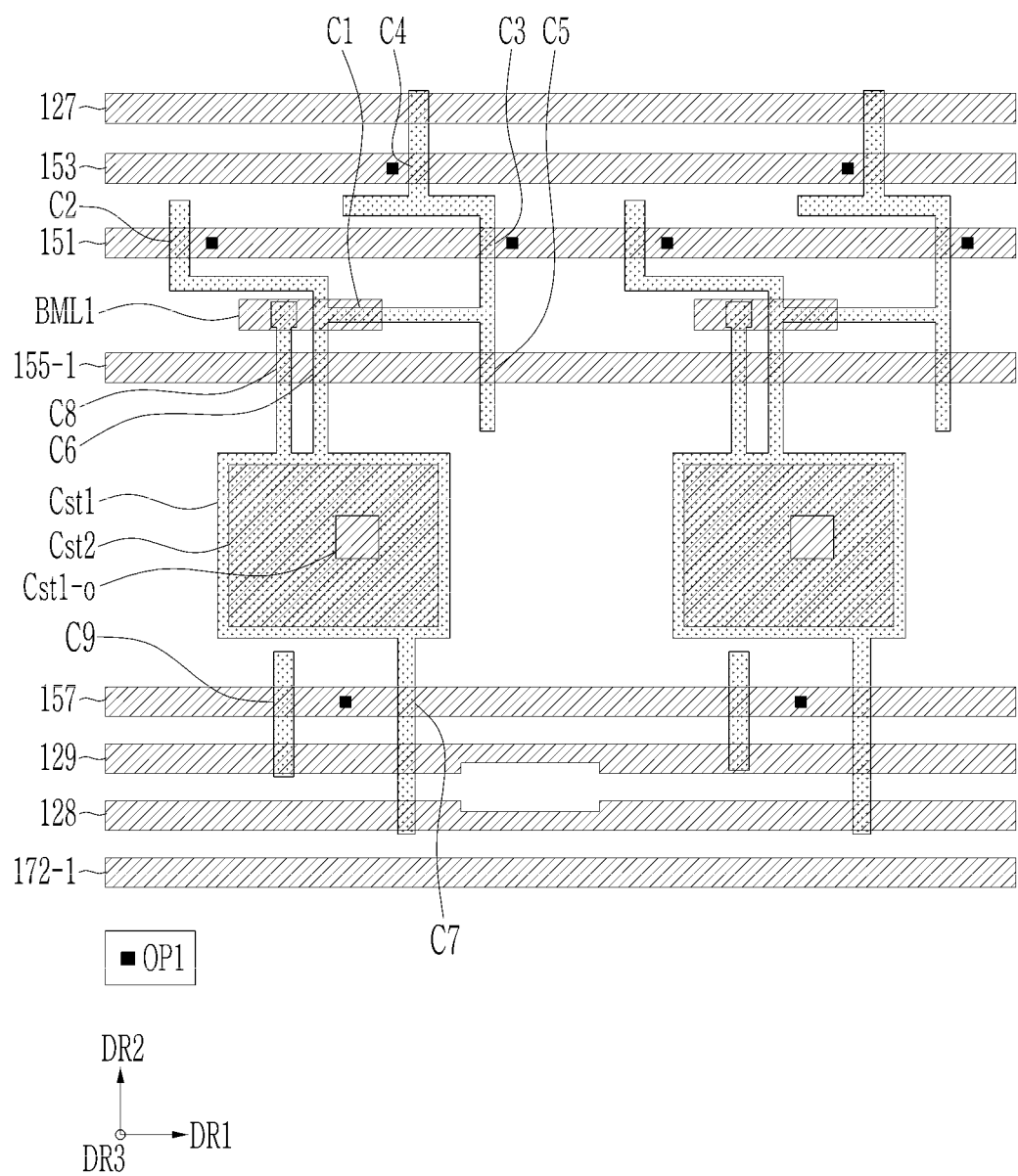

Referring to FIG. 5, a plurality of first openings OP1 are formed in the second insulating layer 142.

For the first openings OP1, a portion overlapping the first scan line 151 in a plan view is positioned adjacent to each of the second semiconductor C2 and the third semiconductor C3, a portion overlapping the first control line 153 in a plan view is positioned adjacent to the fourth semiconductor C4, and a portion overlapping the second control line 157 in a plan view is positioned between the ninth semiconductor C9 and the seventh semiconductor C7.

Figure 6:
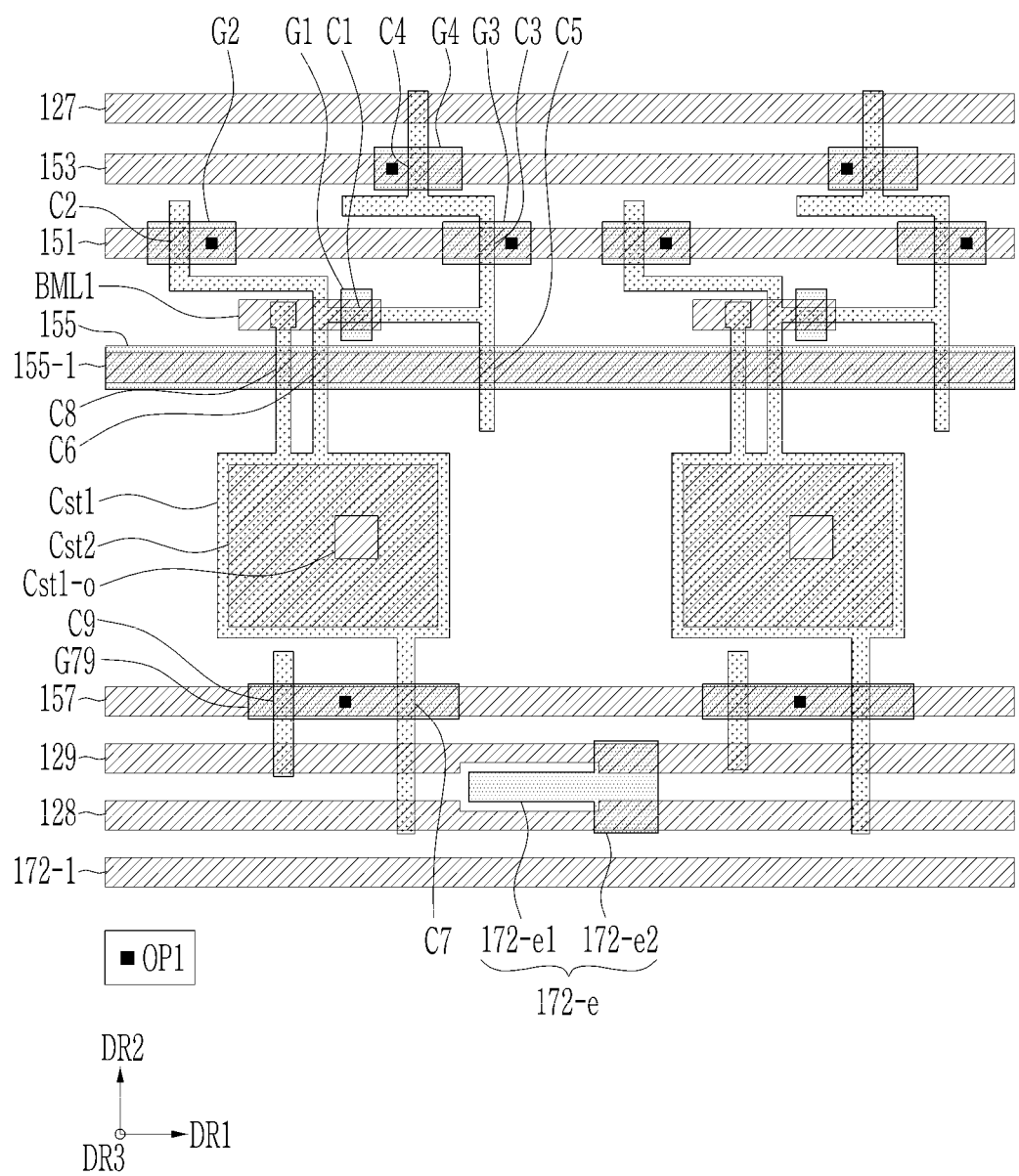

Thereafter, referring to FIG. 6, a second conductive layer is positioned on the second insulating layer 142, and the second conductive layer includes an emission control line 155 extending in the first direction DR1, a first gate electrode G1 (also referred to as a driving gate electrode) having an island-like structure, a second gate electrode G2, a third gate electrode G3, a fourth gate electrode G4, seventh and ninth gate electrodes G79, and a shielding electrode 172e. Herein, portions where the planar emission control line 155 overlaps the fifth semiconductor C5, the sixth semiconductor C6, and the eighth semiconductor C8 respectively serve as the fifth gate electrode, the sixth gate electrode, and the eighth gate electrode.

The first gate electrode (G1; driving gate electrode) overlaps the first semiconductor C1 and the overlapping electrode BML1 in a plan view. The second gate electrode G2 is positioned at a portion overlapping the second semiconductor C2 and the first scan line 151 in a plan view, and is connected to the first scan line 151 through the first opening OP1. The third gate electrode G3 is positioned at a portion overlapping the third semiconductor C3 and the first scan line 151 in a plan view, and is connected to the first scan line 151 through the first opening OP1. The fourth gate electrode G4 is positioned at a portion overlapping the fourth semiconductor C4 and the first control line 153 in a plan view, and is connected to the first control line 153 through the first opening OP1. The seventh and ninth gate electrodes G79 are integrally formed, and are positioned at a portion overlapping the second control line 157, the ninth semiconductor C9, and the seventh semiconductor C7 in a plan view, and are connected to the second control line 157 through the first opening OP1. According to some embodiments, the seventh and ninth gate electrodes G79 may be separated from each other and formed as a seventh gate electrode and a ninth gate electrode, and in this case, they may be connected to the second control line 157 through the first openings OP1.

The second conductive layer also includes a shielding electrode 172e, and the shielding electrode 172e includes a connection portion 172-e1 and an overlapping portion 172-e2. The connection portion 172-e1 extends in the first direction DR1 at a position that does not overlap the overlapping electrode voltage line 129 and the initialization voltage line 128 in a plan view, and the overlapping portion 172-e2 includes a portion overlapping the overlapping electrode voltage line 129 and a portion overlapping the initialization voltage line 128 in a plan view.

The second conductive layer may include a metal such as copper (Cu), molybdenum (Mo), aluminum (Al), titanium (Ti), or a metal alloy thereof, and may be configured as a single layer or multiple layers.

After the second conductive layer is completed, the semiconductor layer that is not covered with the second conductive layer is doped through plasma treatment or doping treatment to have a conductive characteristic that is equivalent to that of a conductor. As a result, the semiconductor layer that is not covered by each gate electrode becomes a conductor to electrically connect adjacent transistors. In addition, the first storage electrode Cst1 positioned in the semiconductor layer is also doped to have the same conductivity as a conductor, thereby configuring one electrode of the storage capacitor Cst.

Referring to FIG. 9, the second insulating layer 142 and the second conductive layer are covered with a third insulating layer 161. The third insulating layer 161 may include an inorganic insulating layer including a silicon oxide (SiO$_x$), a silicon nitride (SiN$_x$), a silicon oxynitride (SiO$_x$N$_y$), or the like. According to some embodiments, the third insulating layer 161 may be formed as an organic insulating layer.

Figure 7:
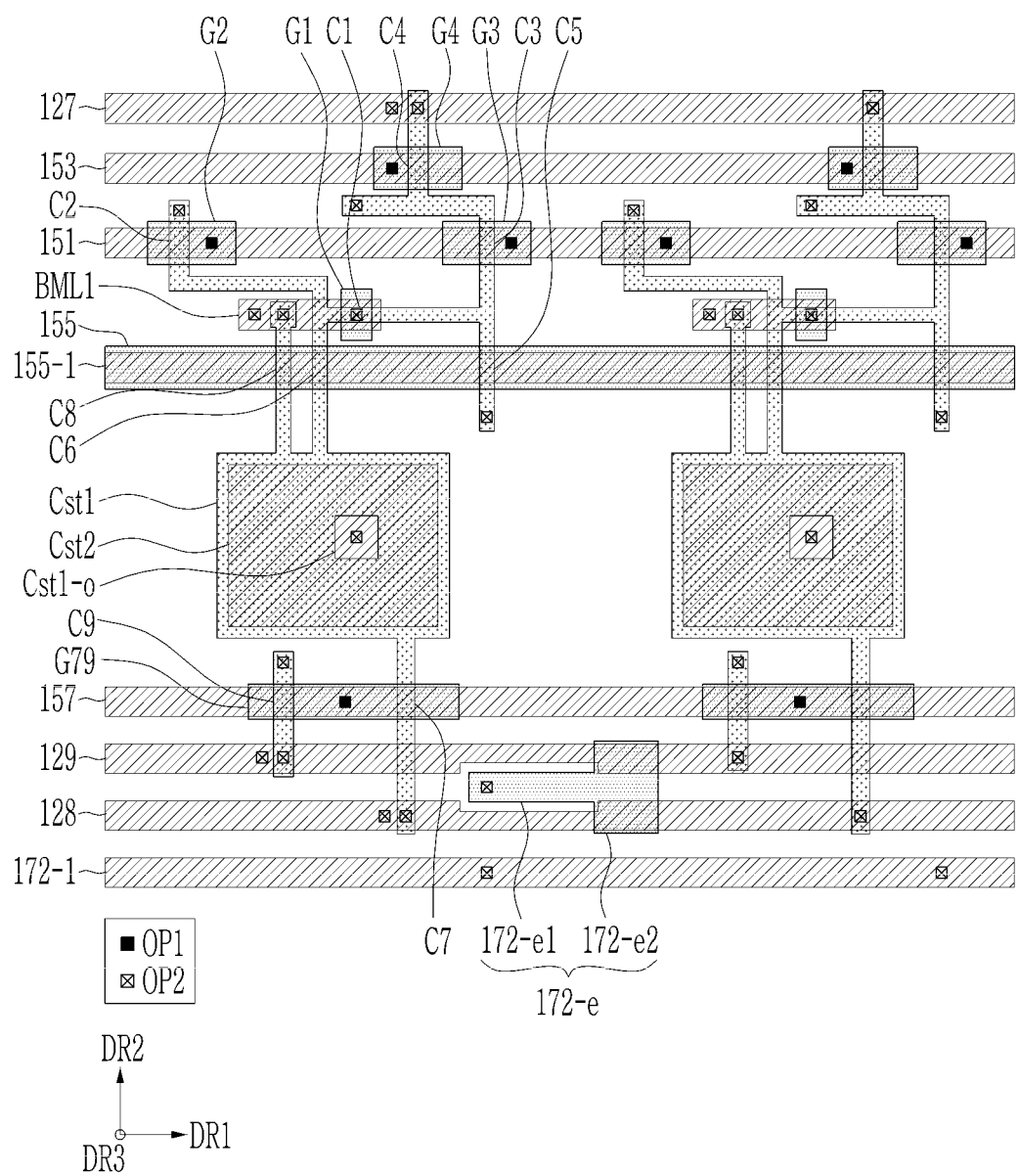

Referring to FIG. 7, a plurality of second openings OP2 are formed in the third insulating layer 161.

The second openings OP2 are formed such that a subsequently formed third conductive layer may be connected to the second conductive layer, the first conductive layer, and the semiconductor layer that are provided therebelow.

Figure 8:
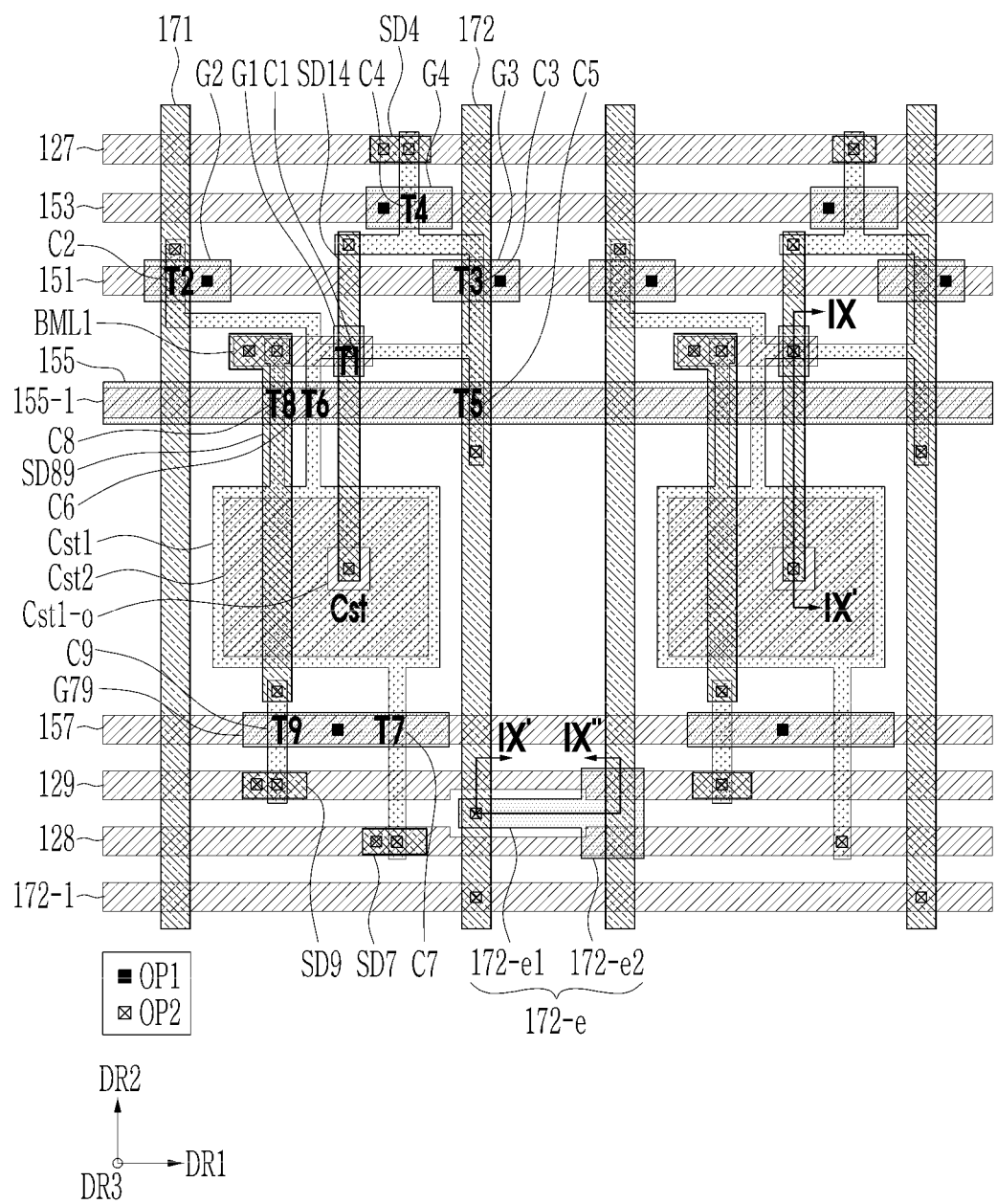

Referring to FIG. 8, a third conductive layer is formed on the third insulating layer 161, and the third conductive layer includes a data line 171 and a driving voltage line 172 extending in the second direction DR2, and additionally includes a plurality of connecting members SD14, SD89, SD4, SD7, and SD9 each having an island-like structure.

The data line 171 is connected to the second semiconductor C2 through the second opening OP2 to transfer the data voltage Vdata to the second semiconductor C2.

The driving voltage line 172 is connected to the fifth semiconductor C5 through the second opening OP2 to transfer the driving voltage ELVDD to the fifth semiconductor C5, is connected to the connection portion 172-e1 of the shielding electrode 172e through another second opening OP2, and transfers the driving voltage ELVDD to the entire overlapping portion 172-e2 and the shielding electrode 172e. In addition, the driving voltage line 172 is connected to the additional driving voltage line 172-1 through another second opening OP2. The driving voltage ELVDD is transferred in the first direction DR1 through the additional driving voltage line 172-1, and is transferred in the second direction DR2 through the driving voltage line 172, and thus the driving voltage ELVDD should not be different depending on a position.

The connecting member SD14 extends in the second direction DR2, a first end thereof connects the overlapping electrode BML1 and the eighth semiconductor C8 through the second opening OP2, and a second end thereof is connected to the ninth semiconductor C9 through the second opening OP2.

The connecting member SD89 extends in the second direction DR2, and a first end thereof is connected to the semiconductor layer extending from the third semiconductor C3 and the fourth semiconductor C4 through the second opening OP2, is connected to the first gate electrode G1 (driving gate electrode) through another second opening OP2, and is connected to the second storage electrode Cst2 through another second opening OP2. When the connecting member SD89 is connected to the second storage electrode Cst2, it is connected to the second storage electrode Cst2 through the opening Cst1-o of the first storage electrode Cst1.

The connecting member SD4 connects the reference voltage line 127 and the fourth semiconductor C4 through the second opening OP2, the connecting member SD7 connects the initialization voltage line 128 and the seventh semiconductor C7 through the second opening OP2, and the connecting member SD9 connects the overlapping electrode voltage line 129 and the ninth semiconductor C9 through the second opening OP2.

The third conductive layer may include a metal such as copper (Cu), molybdenum (Mo), aluminum (Al), titanium (Ti), or a metal alloy thereof, and may be configured as a single layer or multiple layers.

According to some embodiments, two openings OP1 and OP2 are formed to electrically connect each component. However, according to some embodiments, components may be electrically connected to each other by including only one opening OP2. In this case, an additional connecting member may be further included in the third conductive layer.

Referring to FIG. 9, although a structure above the third conductive layer is not illustrated, an organic layer may be positioned on the third conductive layer, and one electrode (anode) of the light emitting diode LED may be positioned on the organic layer. One electrode (anode) of the light emitting diode LED is electrically connected to the first storage electrode Cst1 or the seventh semiconductor C7 to receive an output current of the driving transistor T1. A structure of one electrode (anode) of the light emitting diode LED may vary, and a pixel defining layer having an opening exposing a portion of an electrode (anode) of a light emitting diode LED, a light emitting layer positioned within the opening, and another electrode (cathode) of the light emitting diode LED positioned on the pixel defining layer and the light emitting layer may be further included, and an encapsulation layer may be positioned thereon. Herein, the encapsulation layer includes at least one inorganic layer and at least one organic layer, and may have a triple-layer structure including a first inorganic encapsulation layer, an organic encapsulation layer, and a second inorganic encapsulation layer according to some embodiments. The encapsulation layer may be for protecting the emission layer from moisture or oxygen that may be introduced from the outside. According to some embodiments, the encapsulation layer may include a structure in which an inorganic layer and an organic layer are further sequentially stacked.

In addition, a configuration enabling touch sensing on the encapsulation layer may be further included according to some embodiments, and a configuration such as a light blocking member or a color filter may be further included according to some embodiments. According to some embodiments, a color conversion layer including quantum dots or a reflection control layer may be included instead of a color filter.

In FIG. 8, a position of each of the transistors T1, T2, T3, T4, T5, T6, T7, T8, and T9 and a position of the storage capacitor Cst are clearly illustrated for clarity.

In addition, cross-sectional lines IX-IX' and IX'-IX" are also illustrated in FIG. 8, and hereinafter, a cross-sectional structure along the cross-sectional lines IX-IX' and IX'-IX" of FIG. 8 will be described in more detail with reference to FIG. 9.

FIG. 9 illustrates a cross-sectional view of an emissive display device taken along sectional lines IX-IX' and IX'-IX" of FIG. 8.

Referring to FIG. 9, the overlapping electrode BML1, the additional emission control line 155-1, the second storage electrode Cst2, and the overlapping electrode voltage line 129 included in the first conductive layer are formed on the substrate 110.

A first insulating layer 141 is covered on the first conductive layer, a semiconductor layer is positioned on the first insulating layer 141, and in FIG. 9, the first semiconductor C1 included in the semiconductor layer and the first storage electrode Cst1 including the opening Cst1-o are formed.

The second insulating layer 142 is covered on the semiconductor layer, and the first gate electrode G1 (driving gate electrode), the emission control line 155, and the shielding electrode 172e included in the second conductive layer are provided on the second insulating layer 142.

In FIG. 9, the first openings OP1 positioned in the second insulating layer 142 are not illustrated due to the positions of the cross-sectional lines.

The third insulating layer 161 is covered on the second conductive layer, and the second opening OP2 is positioned on the third insulating layer 161.

The second opening OP2 exposes the connecting portion 172-e1 among the first gate electrode G1 (driving gate electrode), the second storage electrode Cst2, and the shielding electrode 172e.

The data line 171, the connecting member SD14, and the driving voltage line 172 included in the third conductive layer are positioned on the third insulating layer 161.

The connecting member SD14 is connected to the first gate electrode (driving gate electrode) G1 and the second storage electrode Cst2 through the second opening OP2. When the second storage electrode Cst2 and the connecting member SD14 are connected, the second opening OP2 is positioned in the opening Cst1-o positioned in the first storage electrode Cst1 to connect the second storage electrode Cst2 and the connecting member SD14.

The driving voltage line 172 is connected to the connecting portion 172-e1 of the shielding electrode 172e through the second opening OP2. As a result, the driving voltage ELVDD is transferred to the shielding electrode 172e. Referring to FIG. 8, the overlapping portion 172-e2 of the shielding electrode 172e overlaps portions where the data line 171 overlaps the overlapping electrode voltage line 129 and the initialization voltage line 128 in a plan view. In addition, referring to FIG. 9, the overlapping portion 172-e2 of the shielding electrode 172e is positioned under the data line 171, and the overlapping electrode voltage line 129 and the initialization voltage line 128 are positioned therebelow in a cross-sectional view. As a result, voltage fluctuation of the data line 171 is shielded from being transferred to the overlapping electrode voltage line 129 and the initialization voltage line 128 due to the overlapping portions 172-e2 of the shielding electrode 172e. Referring to FIG. 1, the overlapping electrode voltage VBML flowing through the overlapping electrode voltage line 129 is a voltage capable of changing the characteristic of the driving transistor T1, and thus even when the data voltage Vdata flowing through the data line 171 is changed, the overlapping electrode voltage line 129 is not affected by the shielding electrode 172e to which the driving voltage ELVDD is applied, so the characteristic of the driving transistor T1 is not changed.

In addition, the initialization voltage VINT for initializing one electrode (anode) of the light emitting diode LED and the first storage electrode of the storage capacitor Cst is applied to the initialization voltage line 128, and thus when the initialization voltage VINT is changed depending on the data voltage Vdata flowing through the data line 171, pixel initialization is not performed, so a problem may occur in display quality.

However, as illustrated in FIG. 8 and FIG. 9, the shielding electrode 172e is positioned below the data line 171 and overlaps the overlapping electrode voltage line 129 and/or the initialization voltage line 128 on a plane, and thus even when the data voltage Vdata of the data line 171 fluctuates, there is no influence on the overlapping electrode voltage line 129 and/or the initialization voltage line 128. As a result, no error occurs while the pixel PX operates.

In relation to such a shielding characteristic, it will be described while comparing it with the comparative example through FIG. 10 to FIG. 12.

Figure 11:
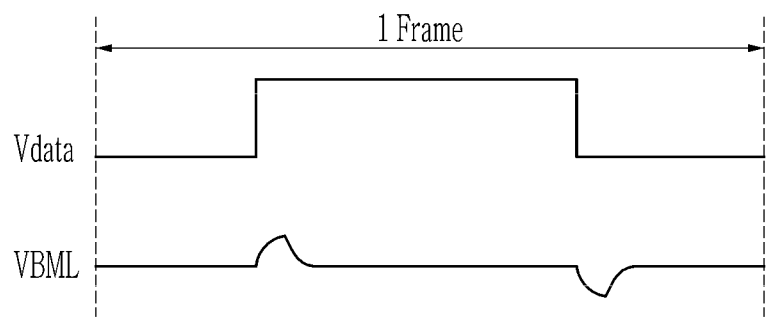
FIG. 11 illustrates a waveform diagram showing a voltage change depending on a data voltage change in a comparative example.
Figure 12:
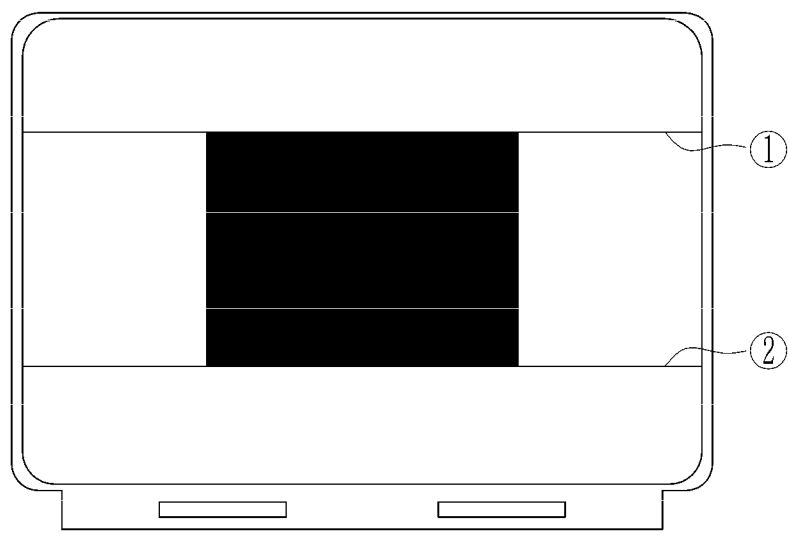
FIG. 12 illustrates a horizontal line defect depending on a change in data voltage in a comparative example.

FIG. 10 illustrates a table comparing specific values for a comparative example and some embodiments, FIG. 11 illustrates a waveform diagram showing a voltage change depending on a data voltage change in a comparative example, and FIG. 12 illustrates a horizontal line defect depending on a change in data voltage in a comparative example.

FIG. 10 to FIG. 12 refer to a comparative example, but unlike the embodiments shown with respect to FIG. 8, the comparative example does not include the shielding electrode 172e, and there is no difference in other structures and they are the same.

Meanwhile, in FIG. 10, a line crosstalk index (LCI) between lines is described, which is a value obtained by converting a magnitude of crosstalk between lines based on one pixel into a numerical value, and a larger LCI value indicates a larger crosstalk value.

In addition, in FIG. 10, a coupling capacitance value between the data line 171 through which the data voltage Vdata flows and the overlapping electrode voltage line 129 through which the overlapping electrode voltage VBML flows or the initialization voltage line 128 through which the initialization voltage VINT flows is also included.

Referring to FIG. 10, it can be confirmed that the LCI value of the embodiments shown with respect to FIG. 8 is smaller than that of the comparative example, and a coupling capacitance value between the data line 171 and the overlapping electrode voltage line 129 and a coupling capacitance value between the data line 171 and the initialization voltage line 128 are also small by the action of the shielding electrode 172e. In particular, it can be seen that a coupling capacitance (Coupling Cap) value is reduced by more than 80% in the embodiments shown with respect to FIG. 8.

Problems occurring in the comparative example will be described in more detail with reference to FIG. 11 and FIG. 12.

First, in FIG. 11, in the comparative example, the coupling capacitance (Coupling Cap) value between the data line 171 and the overlapping electrode voltage line 129 is large, and thus it is shown that when the data voltage Vdata is changed, a value of the overlapping electrode voltage VBML also varies greatly. Particularly, when the value of the variable data voltage Vdata is large, the overlapping electrode voltage VBML also varies greatly, and a largest change in the value of the data voltage Vdata in the data voltage Vdata is when the data voltage Vdata for displaying white is changed from the data voltage Vdata for displaying black or vice versa.

Accordingly, in FIG. 12, In the comparative example, black is displayed only in a central portion of the display area, and after displaying white around it, a screen displayed in the actual comparative example is illustrated.

In FIG. 12, as shown by ① and ②, it can be seen that a problem occurs in that a dark line similar to black is displayed instead of displaying white in a pixel row where the central portion displaying black starts and in the pixel row where it ends.

Such lines are visible for the following reasons.

The overlapping electrode voltage VBML also varies as shown in FIG. 11 when the data voltage Vdata fluctuates as displaying black while displaying white in a pixel column connected to one data line 171 extending in the second direction DR2 from the central portion. Referring to FIG. 12, in the comparative example, because there are a plurality of data lines displaying black while displaying white, the overlapping electrode voltage VBML greatly varies.

Such variation of the overlapping electrode voltage VBML affects all pixels connected to the overlapping electrode voltage line 129. Referring to FIG. 3, even in the comparative example, the overlapping electrode voltage line 129 extends in the first direction DR1, and thus the overlap electrode voltage VBML applied to one pixel row is also varied. As a result, in the driving transistors T1 of the pixels included in one pixel row, as the overlapping electrode voltage VBML applied to the overlapping electrode (second driving gate electrode) fluctuates, a channel characteristic of the driving transistor T1 also varies. Accordingly, as shown by ① and ② in FIG. 12, a problem (horizontal line defect) occurs in that a horizontal line is displayed instead of displaying white in a pixel row where the central portion displaying black starts and in the pixel row where it ends.

However, in the embodiments shown with respect to FIG. 8, even when the coupling capacitance between the data line 171 and the overlapping electrode voltage line 129 is small, a horizontal line defect like that of FIG. 12 does not occur by the action of the shielding electrode 172e.

In addition, in the embodiments shown with respect to FIG. 8, the coupling capacitance between the data line 171 and the initialization voltage line 128 is also small, and thus a problem that occurs because pixels are not initialized does not occur, so that improved display quality may be obtained.

Hereinafter, an emissive display device according to some embodiments will be described with reference to FIG. 13 to FIG. 21.

First, a circuit structure of a pixel including an n-type transistor as a driving transistor according to some embodiments will be described with reference to FIG. 13.

Figure 13:
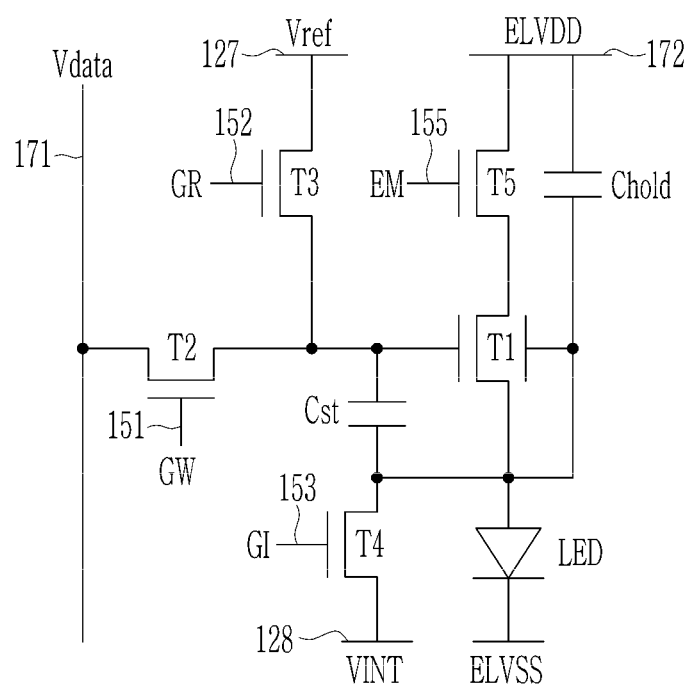
FIG. 13 illustrates an equivalent circuit diagram of a pixel included in an emissive display device according to some embodiments.

FIG. 13 illustrates an equivalent circuit diagram of a pixel included in an emissive display device according to some embodiments.

Another pixel according to FIG. 13 includes a plurality of transistors T1, T2, T3, T4, and T5, a storage capacitor Cst, a hold capacitor Chold, a hold capacitor Chold, and a light emitting diode LED which are connected to wires 127, 128, 151, 152, 153, 155, 171, and 172. Herein, the transistors and the capacitor excluding the light emitting diode LED may constitute a pixel circuit unit, and one pixel may include the pixel circuit unit and the light emitting diode. In the embodiments shown with respect to FIG. 13, all of the transistors T1, T2, T3, T4, and T5 may be classified as n-type transistors. According to some embodiments, the n-type transistor may be formed as an oxide semiconductor transistor including an oxide semiconductor. The n-type transistor may be a transistor that is turned on when a relatively high voltage of a gate electrode is applied.

The wires 127, 128, 151, 152, 153, 155, 171, and 172 are connected to one pixel PX. The wires include a reference voltage line 127, an initialization voltage line 128, a first scan line 151, a second scan line 152, a first control line 153, an emission control line 155, a data line 171, and a driving voltage line 172. Additionally, a common voltage line transferring a driving low voltage ELVSS may be connected to one side of the light emitting diode LED.

The first scan line 151 transfers the first scan signal GW to the second transistor T2, and the second scan line 152 transfers the second scan signal GR to the third transistor T3. The first control line 153 transfers the first control signal GI to the fourth transistor T4, and the emission control line 155 transfers the emission signal EM to the fifth transistor T5.

The data line 171 is a line that transfers the data voltage Vdata generated by the data driver (not illustrated), and accordingly, a magnitude of the emission current transferred to the light emitting diode LED is changed, so that luminance of the light emitting diode LED is also changed. The driving voltage line 172 applies a driving voltage ELVDD. The reference voltage line 127 transfers a reference voltage Vref, and the initialization voltage line 128 transfers an initialization voltage VINT. According to some embodiments, voltages applied to the driving voltage line 172, the reference voltage line 127, and the initialization voltage line 128 may each be a constant voltage.

The driving transistor T1 (also referred to as first transistor) is an n-type transistor and includes an oxide semiconductor as a semiconductor layer. It is a transistor that adjusts a magnitude of an emission current that is outputted to one electrode (anode) of the light emitting diode LED depending on a magnitude of a voltage (i.e., a voltage stored in the storage capacitor Cst) of the gate electrode (hereinafter also referred to as driving gate electrode or first driving gate electrode) of the driving transistor T1. Brightness of the light emitting diode LED may be adjusted depending on the magnitude of the emission current outputted to one electrode of the light emitting diode LED, and thus emission luminance of the light emitting diode LED may be adjusted depending on a data voltage Vdata applied to the pixel. For this purpose, a first electrode of the driving transistor T1 is connected to the driving voltage line 172 via the fifth transistor T5 by being positioned to receive the driving voltage ELVDD. Meanwhile, the second electrode of the driving transistor T1 outputs an emission current to the light emitting diode LED, and is connected to one electrode of the light emitting diode LED. The data voltage Vdata is applied to a driving gate electrode of the driving transistor T1 through the second transistor T2. Meanwhile, the driving gate electrode of the driving transistor T1 is connected to a first electrode (hereinafter referred to as a second storage electrode) of the storage capacitor Cst. Accordingly, the voltage of the gate electrode of the driving transistor T1 changes depending on a voltage stored in the storage capacitor Cst, and an emission current outputted by the driving transistor T1 changes accordingly. The storage capacitor Cst serves to maintain a voltage of the gate electrode of the driving transistor T1 to be constant during one frame. Meanwhile, the driving gate electrode of the driving transistor T1 may also be connected to the third transistor T3, to be initialized by receiving the reference voltage Vref. Additionally, the driving transistor T1 may further include an overlapping electrode (hereinafter also referred to as a second driving gate electrode) overlapping a channel provided in the semiconductor layer, and the overlapping electrode may also be connected to one electrode (anode) of the light emitting diode LED and the second electrode of the fourth transistor T4. The overlapping electrode (second driving gate electrode) is connected to one electrode (anode) of the light emitting diode LED, so that a characteristic of the driving transistor T1 may be enabled to be maintained without being changed during the emission period.

The second transistor T2, which is an n-type transistor, has an oxide semiconductor as a semiconductor layer. The second transistor T2 is a transistor that receives the data voltage Vdata into the pixel. A gate electrode of the second transistor T2 may be connected to the first scan line 151. The first electrode of the second transistor T2 is connected to the data line 171, and the second electrode of the second transistor T2 is connected to the driving gate electrode of the driving transistor T1, the second electrode of the third transistor T3, and the second storage electrode of the storage capacitor Cst. When the second transistor T2 is turned on by the positive voltage of the first scan signal GW transferred through the first scan line 151, the data voltage Vdata transferred through the data line 171 is transferred to the driving gate electrode of the driving transistor T1, and in this case, the data voltage Vdata is stored in the second storage electrode of the storage capacitor Cst.

The third transistor T3, which is an n-type transistor, has an oxide semiconductor as a semiconductor layer. The third transistor T3 serves to transfer the reference voltage Vref to the gate electrode of the driving transistor T1 and the second storage electrode of the storage capacitor Cst. A gate electrode of the third transistor T3 is connected to the second scan line 152, and a first electrode of the third transistor T3 is connected to the reference voltage line 127. The second electrode of the third transistor T3 is connected to the second storage electrode of the storage capacitor Cst, the driving gate electrode of the driving transistor T1, and the second electrode of the second transistor T2. The third transistor T3 is turned on by a positive voltage of the second scan signal GR transferred through the second scan line 152, and in this case, the reference voltage Vref is transferred to the gate electrode of the driving transistor T1 and the second storage electrode of the storage capacitor Cst.

The fourth transistor T4, which is an n-type transistor, has an oxide semiconductor as a semiconductor layer. The fourth transistor T4 serves to initialize one electrode (anode) of the light emitting diode LED. Hereinafter, the fourth transistor T4 is also referred to as a light emitting diode initialization transistor. When the fourth transistor T4 initializes one electrode (anode) of the light emitting diode LED, the overlapping electrode (second driving gate electrode) of the driving transistor T1 and the first storage electrode of the storage capacitor Cst are also Initialized. The gate electrode of the fourth transistor T4 is connected to the first control line 153, the second electrode of the fourth transistor T4 is connected to one electrode of the light emitting diode LED, the overlapping electrode (second driving gate electrode) of the driving transistor T1, and the first storage electrode of the storage capacitor Cst, and the first electrode of the fourth transistor T4 is connected to the initialization voltage line 128. When the fourth transistor T4 is turned on by a positive voltage of the first control signal GI flowing through the first control line 153, the initialization voltage VINT is applied to one electrode of the light emitting diode LED, the overlapping electrode (second driving gate electrode) of the driving transistor T1, and a first storage electrode of the storage capacitor Cst to be initialized.

The fifth transistor T5, which is an n-type transistor, has an oxide semiconductor as a semiconductor layer. The fifth transistor T5 serves to transfer the driving voltage ELVDD to the driving transistor T1. A gate electrode of the fifth transistor T5 is connected to the emission control line 155, a first electrode of the fifth transistor T5 is connected to the driving voltage line 172, and a second electrode of the fifth transistor T5 is connected to the first electrode of the driving transistor T1. When the fifth transistor T5 is turned on by a positive voltage of the emission signal EM flowing through the emission control line 155, the driving voltage ELVDD is applied to the first electrode of the driving transistor T1.

According to some embodiments, all of the transistors T1, T2, T3, T4, and T5 including the driving transistor T1 may have an overlapping electrode overlapping a channel included in the semiconductor layer. In this case, in all the transistors T2, T3, T4, and T5 except the driving transistor T1, each overlapping electrode is electrically connected to each gate electrode, and each overlapping electrode may serve as another gate electrode (hereinafter also referred to as second gate electrode).

In the above description, all the transistors T1, T2, T3, T4, and T5 are formed as n-type transistors and an oxide semiconductor is used for the semiconductor layer, but what is necessary for the transistors is just an n-type transistor, and a silicon semiconductor may also be used for the semiconductor layer.

The first storage electrode of the storage capacitor Cst is connected to the second electrode of the fourth transistor T4, the overlapping electrode (second driving gate electrode) of the driving transistor T1, and one electrode (anode) of the light emitting diode LED, and the second storage electrode is connected to the gate electrode of the driving transistor T1, the second electrode of the third transistor T3, and the second electrode of the second transistor T2. The storage capacitor Cst serves to maintain a voltage of the driving gate electrode of the driving transistor T1 to be constant during one frame.

The first electrode of the hold capacitor Chold is connected to the driving voltage line 172, and the second electrode of the hold capacitor (Chold) is connected to the overlapping electrode (second driving gate electrode) of the driving transistor T1, one electrode (anode) of the light emitting diode LED, the second electrode of the fourth transistor T4, and the first storage electrode of the storage capacitor Cst. The hold capacitor Chold makes the voltage of the overlapping electrode (second driving gate electrode) of the driving transistor T1 and one electrode (anode) of the light emitting diode (LED) constant, and in particular, it serves to keep it constant during the emission period.

Although the pixel PX of FIG. 13 has been described as including five transistors T1 to T5 and two capacitors (holding capacitor Cst and hold capacitor Chold), the present invention is not limited thereto.

In the above, a circuit structure of a pixel according to some embodiments has been described with reference to FIG. 13. Hereinafter, a waveform of a signal applied to the pixel of FIG. 13 and an operation of the pixel according to the waveform will be described with reference to FIG. 14.

Figure 14:
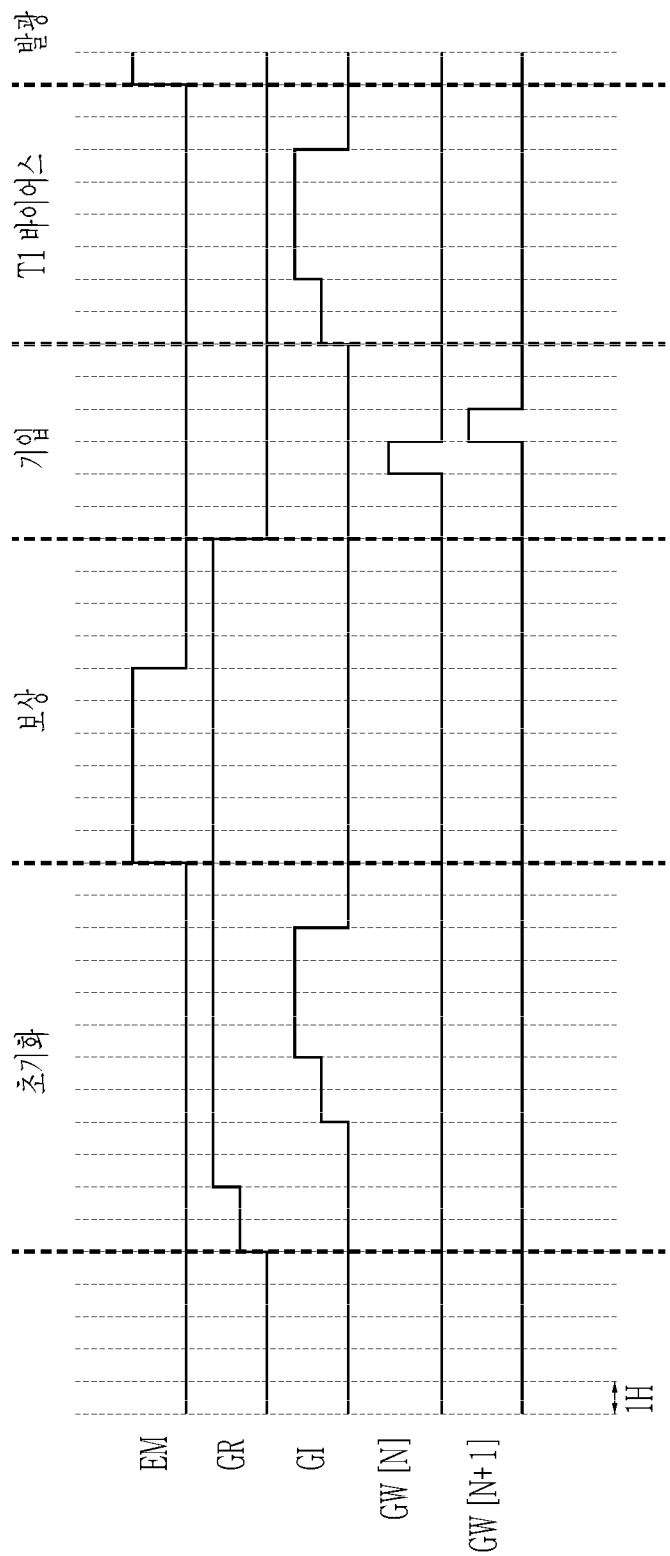
FIG. 14 illustrates a waveform diagram showing a signal applied to the pixel of FIG. 13.

FIG. 14 illustrates a waveform diagram showing a signal applied to the pixel of FIG. 13.

Referring to FIG. 14, when a signal applied to a pixel is divided into periods, it may be divided into an initialization period, a compensation period, a writing period, and an emission period, and additionally, a T1 bias period may be further included between the writing period and the emission period. Herein, the T1 bias period may help the driving transistor T1 to perform a same operation by maintaining a voltage relationship of the respective electrodes of the driving transistor T1 to not change even when a data voltage is not transmitted during the writing period, and may enable the emissive display device to perform various driving methods such as low-power driving or high-speed driving. Meanwhile, a gate-on voltage and a gate-off voltage may be a high or low voltage depending on a type of transistor to which they are applied, and in the n-type transistor, the high voltage may be the gate-on voltage and the low voltage may be the gate-off voltage. FIG. 14 illustrates a signal that increases twice when changing from a low voltage to a high voltage, and according to some embodiments, it may be changed to a highest high voltage at once.

First, the emission period is a period during which the light emitting diode LED emits light, and the gate-on voltage is applied to an emission signal EM to turn on the fifth transistor T5. In this case, all of the other signals (second scan signal GR, the first control signal GI, and the first scan signal GW) have gate-off voltages. When the fifth transistor T5 is turned on so that the driving voltage ELVDD is transferred to the driving transistor T1, an output current is generated depending on a voltage of a gate electrode of the driving transistor T1. In this case, the output current of the driving transistor T1 is transferred to the light emitting diode LED so that the light emitting diode LED emits light. In addition, during the emission period, the overlapping electrode (second driving gate electrode) of the driving transistor T1 and one electrode (anode) of the light emitting diode LED are connected in order to ensure that the characteristic of the driving transistor T1 generating the output current can be constant. In FIG. 14, the emission period during which the emission signal EM applies a gate-on voltage is hardly illustrated, but in reality, the emission period has a longest time. However, the emission period is simply illustrated in FIG. 14 without specific explanation because only the above simple operation is performed.

When the emission period ends, the initialization period is entered.

As the emission signal EM is changed to the gate-off voltage, the emission period ends. Thereafter, the second scan signal GR is changed to the gate-on voltage, it enters the initialization period, and thereafter, the first control signal GI is also changed to the gate-on voltage during the emission period. In this case, the emission signal EM and the first scan signal GW maintain gate-off voltages.

During the initialization period, the third transistor T3 to which the second scan signal GR is applied is turned on. The reference voltage Vref is transferred to the driving gate electrode of the driving transistor T1 and the second storage electrode of the storage capacitor Cst by the turned-on third transistor T3 to be initialized. Herein, the reference voltage Vref may have a high voltage value capable of turning on the driving transistor T1.

Thereafter, the fourth transistor T4 to which the first control signal GI is applied is turned on, the initialization voltage VINT is transmitted to one electrode (anode) of the light emitting diode (LED), the first storage electrode of the storage capacitor Cst, and the overlapping electrode (second driving gate electrode) of the driving transistor T1 to be initialized by the fourth transistor T4.

Thereafter, after the first control signal GI is changed to a gate-off voltage, the emission signal EM is changed to a gate-on voltage, and the compensation period is entered. In this case, the second scan signal GR maintains the gate-on voltage, and the first scan signal GW maintains the gate-off voltage.

The fifth transistor T5 is turned on by the emission signal EM to transmit the driving voltage ELVDD to the first electrode of the driving transistor T1. During the initialization period, the voltage of the first storage electrode of the storage capacitor Cst is charged to the initialization voltage VINT and the driving transistor T1 is turned on by the reference voltage Vref, and thus as the driving voltage ELVDD transferred to the first electrode of the driving transistor T1 is transferred to the first storage electrode of the storage capacitor Cst, the voltage of the first storage electrode increases. When the voltage of the first storage electrode increases and is lower than the voltage of the driving gate electrode of the driving transistor T1 by the threshold voltage Vth, the driving transistor T1 is turned off and the voltage at that time is stored in the first storage electrode of the storage capacitor Cst. Because the voltage of the driving gate electrode of the driving transistor T1 has the reference voltage Vref, a voltage value of the first storage electrode of the storage capacitor Cst at this time may be expressed as Equation 2 below.

$$\text{Voltage of the first sustain electrode} = V_{ref} - V_{th} \qquad \text{Equation 2}$$

Referring to FIG. 13, the first storage electrode and the overlapping electrode (second driving gate electrode) of the driving transistor T1 are connected, and the voltage value of the overlapping electrode (second driving gate electrode) of the driving transistor T1 may also be the same as in Equation 2.

Thereafter, after the emission signal EM is changed to a gate-off voltage, the second scan signal GR is also changed to a gate-off voltage and it enters the writing period.

During the writing period, the first scan signal GW may be applied as the gate-on voltage for 1 H, and the gate-on voltage may be sequentially applied to the first scan line 151 of each row of the first scan signal GW.

The second transistor T2 is turned on by the gate-on voltage of the first scan signal GW, and thus the data voltage Vdata is transferred as voltages of the driving gate electrode of the driving transistor T1 and the second storage electrode of the storage capacitor Cst by the turned-on second transistor T2. Because the voltage of the second storage electrode of the storage capacitor Cst is changed, the voltage of the first storage electrode of the storage capacitor Cst is also changed in proportion to it.

More specifically, the voltage of the second storage electrode of the storage capacitor Cst has the reference voltage Vref value and is changed to the data voltage Vdata during the writing period before entering the writing period, and thus it fluctuates by a value obtained by subtracting the reference voltage Vref from the data voltage Vdata. Accordingly, the voltage of the first storage electrode of the storage capacitor Cst varies by a maximum value obtained by subtracting the reference voltage Vref from the data voltage Vdata. The voltage of the first storage electrode of the storage capacitor Cst before entering the writing period is the same as in Equation 2, and thus the voltage of the first storage electrode of the storage capacitor Cst after the writing period may be expressed by Equation 3 below.

$$\text{Voltage of first storage electrode} = V_{ref} - V_{th} + \alpha(V_{data} - V_{ref}) \qquad \text{Equation 3}$$

Herein, α may have a value that is greater than 0 and less than or equal to 1.

Thereafter, in FIG. 14, as the emission signal EM is changed to a gate-on voltage, the emission period is entered.

During the emission period, the gate-on voltage is applied to the emission signal EM to turn on the fifth transistor T5 so that the driving voltage ELVDD is transferred to the first electrode of the driving transistor T1, and the driving transistor T1 generates an output current.

A magnitude of the output current of the driving transistor T1 is determined depending on a value obtained by subtracting the threshold voltage Vth from a level at which the voltage of the driving gate electrode is higher than the voltage of the second electrode of the driving transistor T1. The voltage value of Equation 3 is the same as the voltage value of the second electrode of the driving transistor T1, and the voltage value of the driving gate electrode is the same as the data voltage Vdata, and thus a value of the output current is proportional to a value obtained by subtracting the voltage value of Equation 3 and the threshold voltage Vth from the data voltage Vdata. In summary, the output current value of the driving transistor T1 is as shown in Equation 4.

$$\text{Output current} \propto (1-\alpha)(V_{data} - V_{ref}) \qquad \text{Equation 4}$$

In Equation 4, it is determined regardless of the threshold voltage Vth of the driving transistor T1, and thus although the threshold voltage Vth of each driving transistor T1 is varied, the output current value is not affected, and thus display quality is constant.

Referring to FIG. 13, the overlapping electrode (second driving gate electrode) of the driving transistor T1 is also connected to the second electrode of the driving transistor T1, and thus the channel characteristic of the driving transistor T1 is enabled to be maintained without being changed.

Meanwhile, referring to FIG. 14, the T1 bias period may proceed after the writing period ends, and during the T1 bias period, the first control signal GI is changed to a gate-on voltage at least once and then changed to a gate-off voltage again.

When the first control signal GI is once applied to the high level voltage, a voltage of the overlapping electrode (second driving gate electrode) of the driving transistor T1 is changed to the initialization voltage VINT. As a result, even when the voltage of the overlapping electrode (second driving gate electrode) of the driving transistor T1 is changed due to a leakage current or the like, the voltage may be enabled to be refreshed, and voltages of the other electrodes (the driving gate electrode, the first electrode, and the second electrode) of the driving transistor T1 may also be enabled to be refreshed to prevent a variation in a characteristic of the driving transistor T1. In addition, during the T1 bias period, even when the data voltage Vdata is not applied in the writing period, even when the data voltage Vdata applied to the existing frame is lowered, it may be raised again to keep an output current of the driving transistor T1 constant during the emission period. As a result, various driving methods such as low-power driving or high-speed driving of the emissive display device may be enabled.

According to some embodiments, the T1 bias period may be omitted in a driving method of the pixel. In addition, the driving method of the pixel according to some embodiments may include a first driving method in which the T1 bias period is included and a second driving method in which the T1 bias period is not included, the first driving method may be operated during some periods, and the second driving method may be operated during remaining periods.

In the above, the circuit structure and operation of the pixel have been described with reference to FIG. 13 and FIG. 14.

Hereinafter, a stacked structure of a pixel will be described in more detail with reference to FIG. 15 to FIG. 21.

A planar structure of a pixel circuit unit in a pixel according to some embodiments will be described in more detail with reference to FIG. 15 to FIG. 20. That is, the light emitting diode LED is not illustrated in FIG. 15 to FIG. 20 below, but the structure of the pixel circuit unit positioned below the light emitting diode LED will be described.

FIG. 15 to FIG. 20 illustrate top plan views of each layer depending on a manufacturing procedure of the emissive display device according to embodiments shown with respect to FIG. 13.

Figure 15:
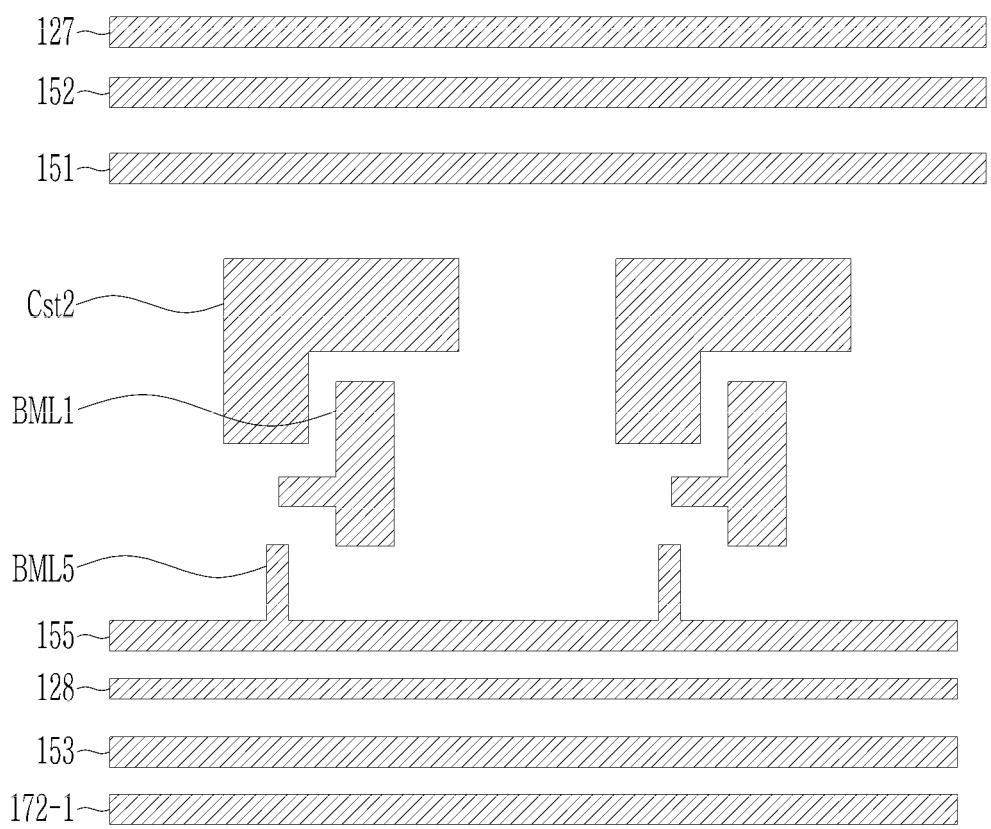
FIG. 15 to FIG. 20 illustrate top plan views of each layer depending on a manufacturing procedure of the emissive display device according to the embodiments shown with respect to FIG. 13.

Referring to FIG. 15, a first conductive layer is positioned on the substrate 110, a first conductive layer includes a reference voltage line 127, a second scan line 152, a first scan line 151, an emission control line 155, an initialization voltage line 128, a first control line 153, and an additional driving voltage line 172-1 extending in the first direction DR1, and also includes an overlapping electrode BML1 having an island-like structure and a second storage electrode Cst2.

Figure 21:
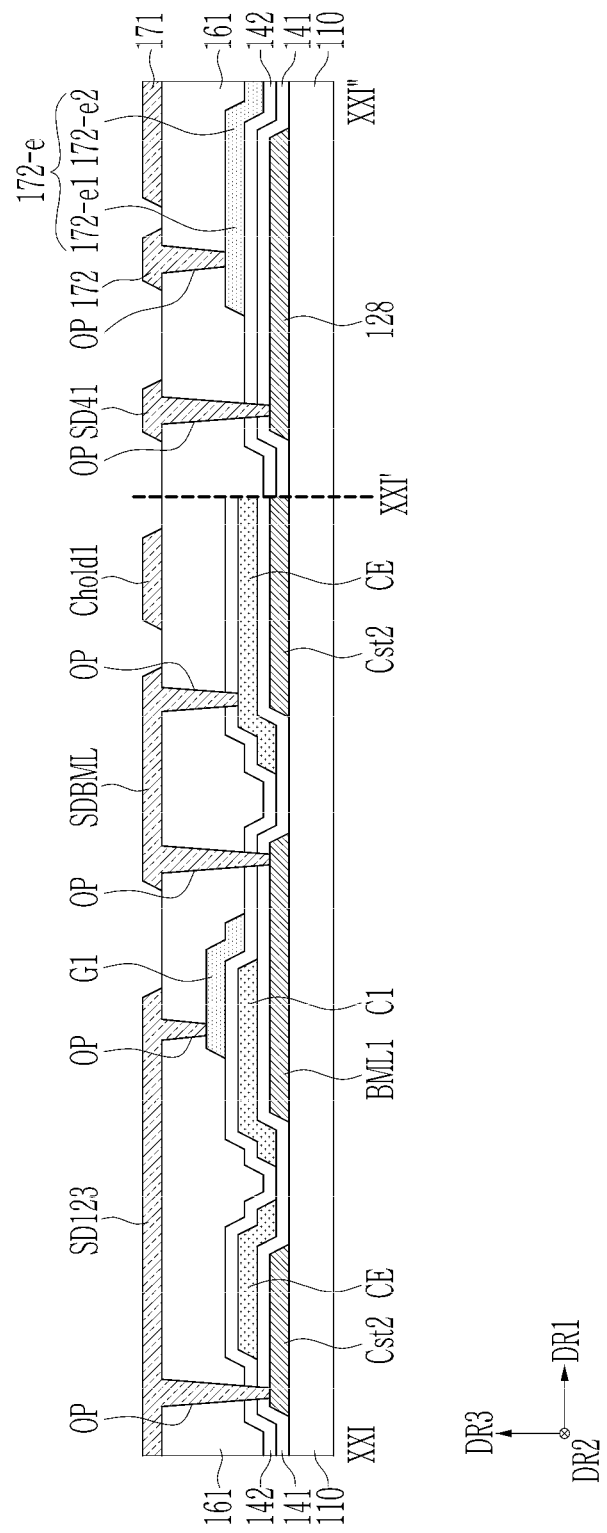
FIG. 21 illustrates a cross-sectional view of an emissive display device taken along the cross-sectional lines XXI-XXI' and XXI'-XXI" of FIG. 20.

In FIG. 21, the substrate 110 may include a material that has a rigid property such as glass so as to not bend, or may include a flexible material that can be bent, such as plastic or a polyimide. In the case of a flexible substrate, it may be to have a structure in which a two-layer structure of a polyimide and a barrier layer formed of an inorganic insulating material thereon is doubly formed.

The first conductive layer may include following voltage lines extending in the first direction DR1.

The reference voltage line 127 transfers the reference voltage Vref in the first direction DR1, the second scan line 152 transmits the second scan signal GR in the first direction DR1, the first scan line 151 transfers the first scan signal GW in the first direction DR1, the light emission control line 155 transfers the emission signal EM in the first direction DR1, the initialization voltage line 128 transfers the initialization voltage VINT in the first direction DR1, the first control line 153 transfers the first control signal GI in the first direction DR1, and the additional driving voltage line 172-1 transfers the driving voltage ELVDD in the first direction DR1. Referring to FIG. 15, an additional overlapping electrode BML5 protruding in the second direction DR2 is formed in the emission control line 155.

In addition, the first conductive layer includes a second storage electrode Cst2 and an overlapping electrode BML1 having an island-like structure. The overlapping electrode BML1 may also serve as the second gate electrode of the driving transistor T1, and may overlap the channel and the driving gate electrode of the driving transistor T1 to be subsequently formed in a plan view.

The first conductive layer may include a metal such as copper (Cu), molybdenum (Mo), aluminum (Al), titanium (Ti), or a metal alloy thereof, and may be configured as a single layer or multiple layers.

Referring to FIG. 21, a first insulating layer 141 is covered on the substrate 110 and the first conductive layer. The first insulating layer 141 may include an inorganic insulating layer including a silicon oxide (SiOx), a silicon nitride (SiNx), a silicon oxynitride ($SiO_xN_y$), or the like.

Figure 16:
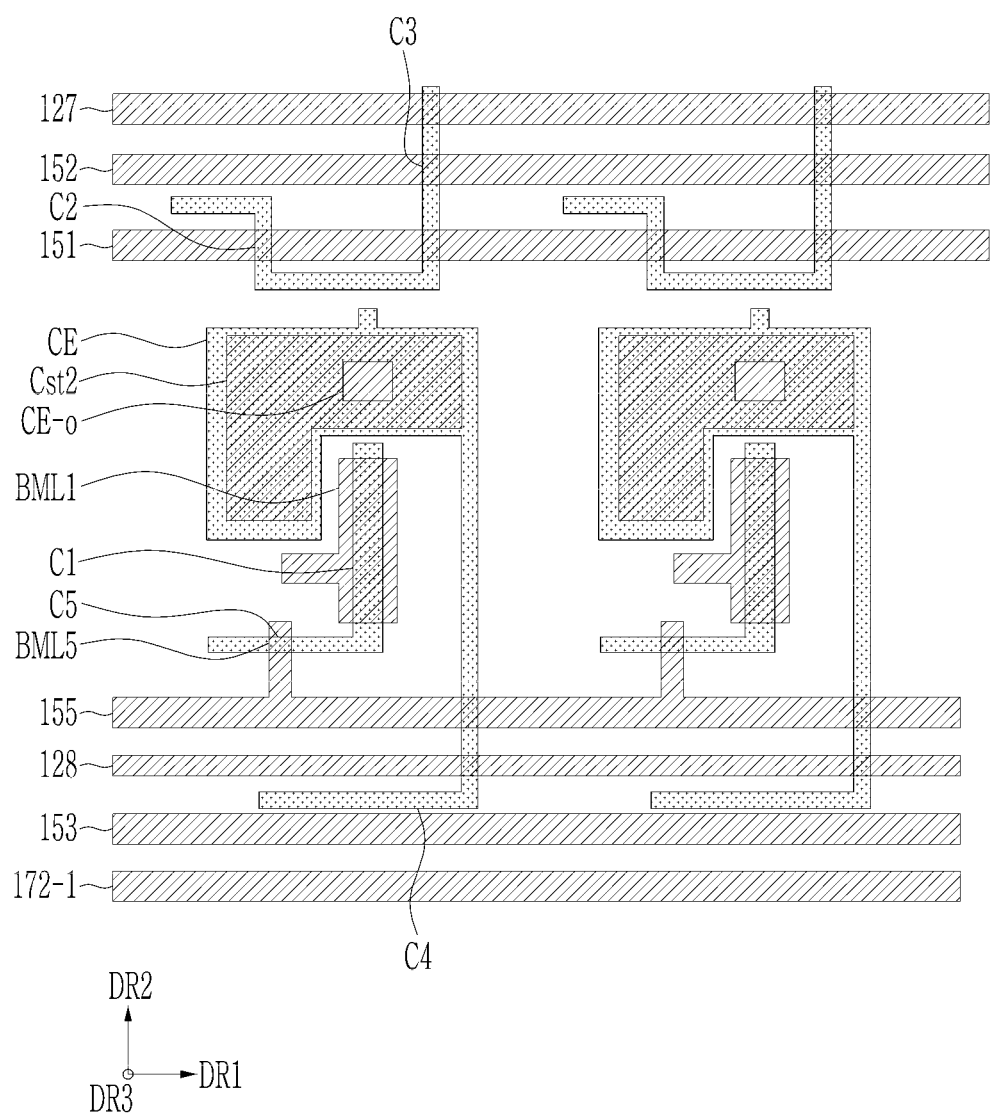

Referring to FIG. 16, a semiconductor layer is positioned on the first insulating layer 141, the semiconductor layer includes a capacitor electrode CE and a fourth semiconductor C4 extending downward from the capacitor electrode CE, and also includes a first semiconductor C1 and a fifth semiconductor C5 that are connected and a second semiconductor C2 and a third semiconductor C3 that are connected. The semiconductor layer may be formed of an oxide semiconductor.

The capacitor electrode CE includes an opening Ce-o, and is connected to the fourth semiconductor having a structure that extends in a direction that is opposite to the second direction DR2, and then is bent in a direction opposite to the first direction DR1. The fourth semiconductor C4 has a structure that passes through the emission control line 155 and the initialization voltage line 128 and is bent in a direction that is opposite to the first direction DR1. Herein, the capacitor electrode CE may serve as a first storage electrode of the storage capacitor Cst and a second electrode of the hold capacitor Chold.

The first semiconductor C1 and the fifth semiconductor C5 are connected to each other, and the first semiconductor C1 overlaps the overlapping electrode BML1 in a plan view and extends in the first direction DR1, and it is connected to the fifth semiconductor C5 while being bent in a direction opposite to the second direction DR2. The fifth semiconductor C5 extends to a portion passing through the additional overlapping electrode BML5 which is a protrusion of the emission control line 155.

The second semiconductor C2 and the third semiconductor C3 are connected to each other, and the second semiconductor C2 includes a structure that extends in the first direction DR1 along the first scan line 151 and crosses the first scan line 151 while being bent in the second direction DR2, and is connected to the third semiconductor C3 while extending in the first direction DR1 again. The third semiconductor C3 extends in the second direction DR2, passes through the first scan line 151 and the second scan line 152, and extends above the reference voltage line 127.

Referring to FIG. 21, the second insulating layer 142 is covered on the first insulating layer 141 and the semiconductor layer. The second insulating layer 142 may include an inorganic insulating layer including a silicon oxide (SiO$_x$), a silicon nitride (SiN$_x$), a silicon oxynitride (SiO$_x$N$_y$), or the like.

Figure 17:
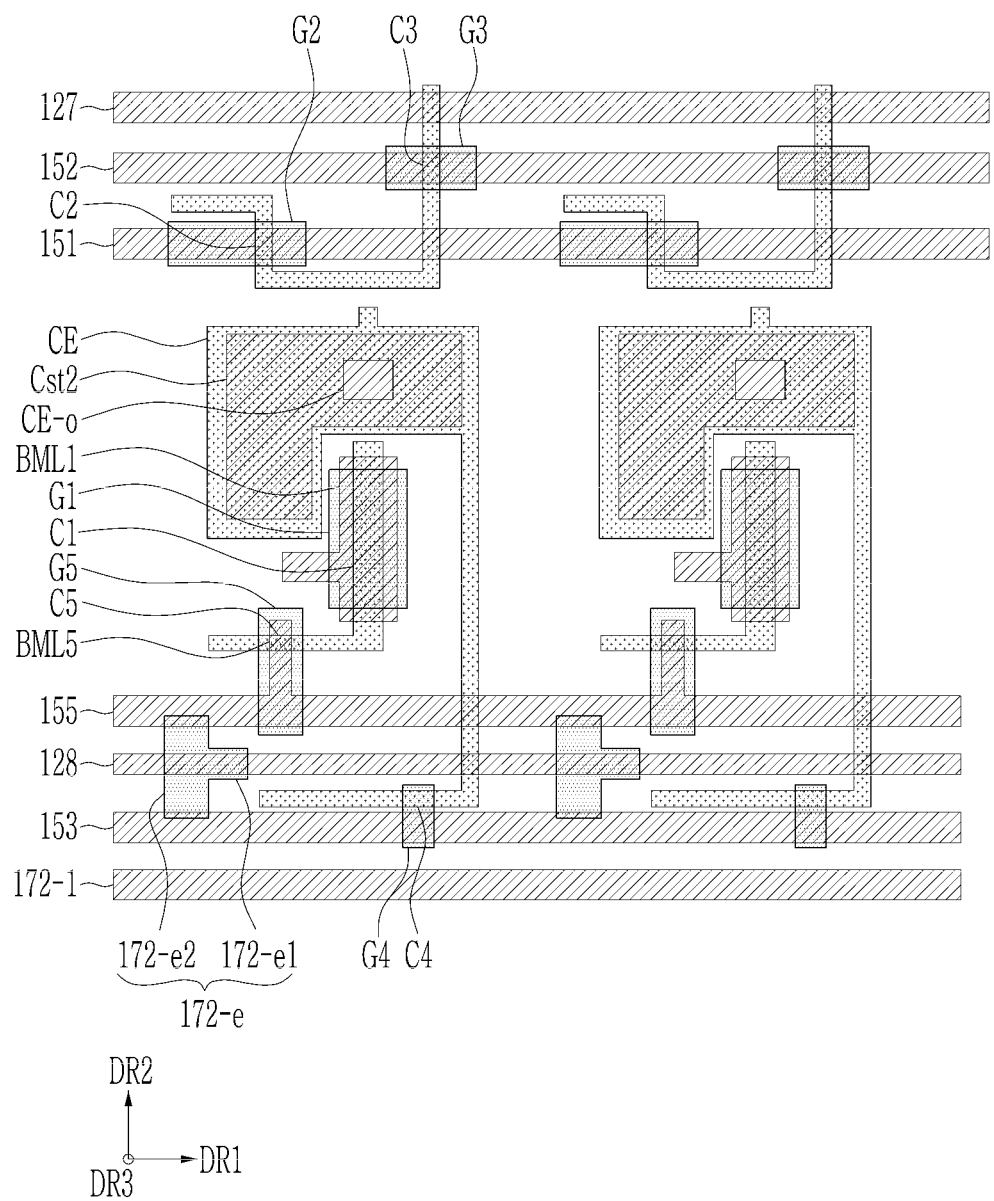

Referring to FIG. 17, a second conductive layer is positioned on the second insulating layer 142, and the second conductive layer includes a first gate electrode G1 (also referred to as driving gate electrode), a second gate electrode G2, a third gate electrode G3, a fourth gate electrode G4, a fifth gate electrode G5, and a shielding electrode 172e.

The first gate electrode (G1; driving gate electrode) overlaps the first semiconductor C1 and the overlapping electrode BML1 in a plan view. The second gate electrode G2 is positioned at a portion overlapping the second semiconductor C2 and the first scan line 151 in a plan view, and the third gate electrode G3 is positioned at a portion overlapping the third semiconductor C3 and the second scan line 152 in a plan view. The fourth gate electrode G4 is positioned at a portion overlapping the fourth semiconductor C4 and the first control line 153 in a plan view, and the fifth gate electrode G5 is positioned at a portion overlapping the fifth semiconductor C5, the emission control line 155, and the additional overlapping electrode BML5 protruding from the light emission control line 155 in a plan view.

The second conductive layer also includes a shielding electrode 172e, and the shielding electrode 172e includes a connection portion 172-e1 and an overlapping portion 172-e2. The connecting portion 172-e1 and the overlapping portion 172-e2 may be formed at a position overlapping the initialization voltage line 128 in a plan view, and the overlapping portion 172-e2 may also overlap portions of the light emission control line 155 and the first control line 153 adjacent to each other while extending in the second direction DR2 in a plan view.

The second conductive layer may include a metal such as copper (Cu), molybdenum (Mo), aluminum (Al), titanium (Ti), or a metal alloy thereof, and may be configured as a single layer or multiple layers.

After the second conductive layer is completed, the semiconductor layer that is not covered with the second conductive layer is doped through plasma treatment or doping treatment to have a conductive characteristic that is equivalent to that of a conductor. As a result, the semiconductor layer that is not covered by each gate electrode becomes a conductor to electrically connect adjacent transistors. In addition, the capacitor electrode CE provided in the semiconductor layer may also be doped to have the same conductivity as a conductor, so as to serve as the first storage electrode of the storage capacitor Cst and the second electrode of the hold capacitor Chold.

Referring to FIG. 21, the second insulating layer 142 and the second conductive layer are covered with a third insulating layer 161. The third insulating layer 161 may include an inorganic insulating layer including a silicon oxide (SiO$_x$), a silicon nitride (SiN$_x$), a silicon oxynitride (SiO$_x$N$_y$), or the like. According to some embodiments, the third insulating layer 161 may be formed as an organic insulating layer.

Figure 18:
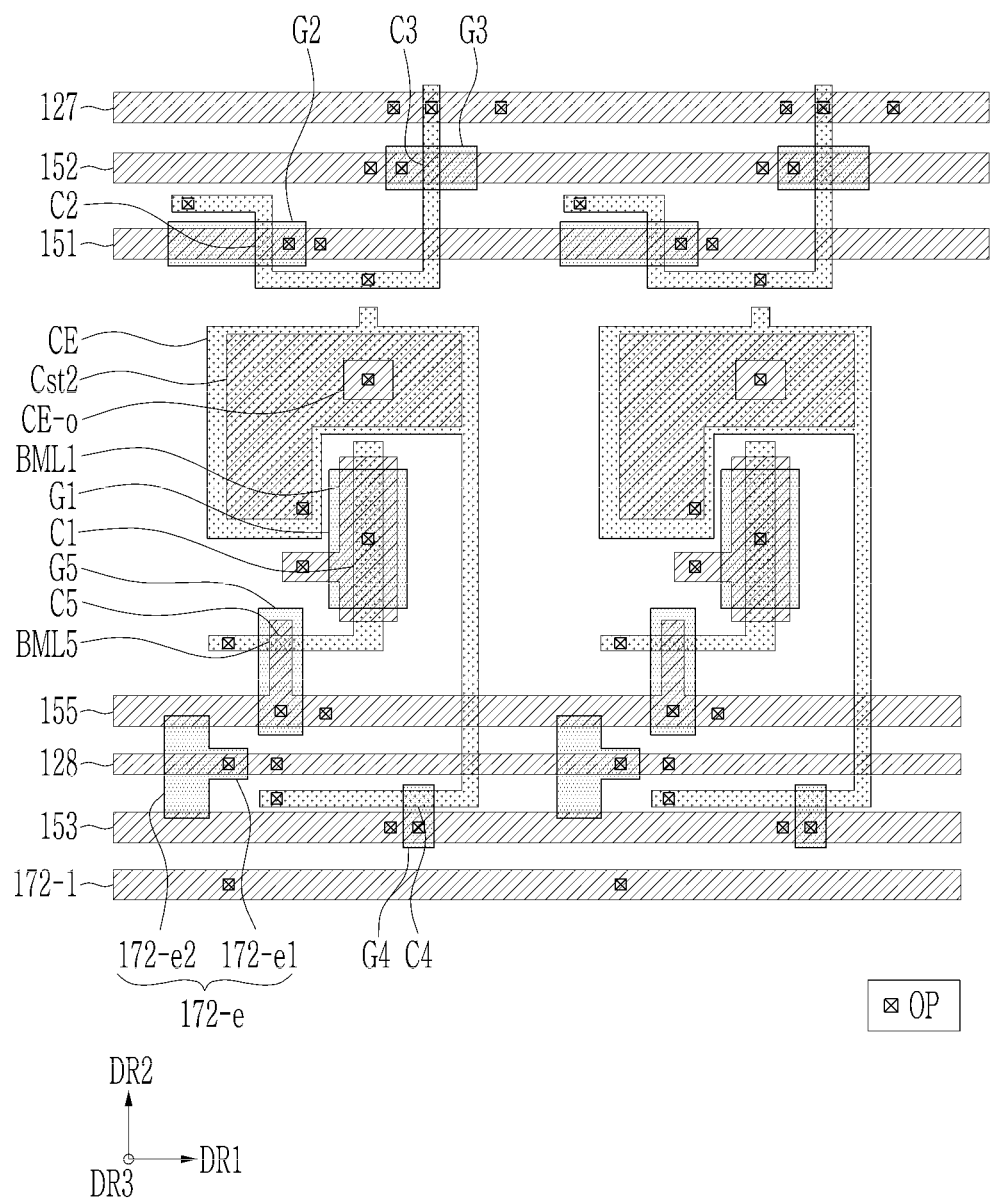

Referring to FIG. 18, a plurality of openings OP are formed in the third insulating layer 161.

The openings OP are formed such that a subsequently formed third conductive layer may be connected to the second conductive layer, the first conductive layer, and the semiconductor layer that are provided therebelow.

Figure 19:
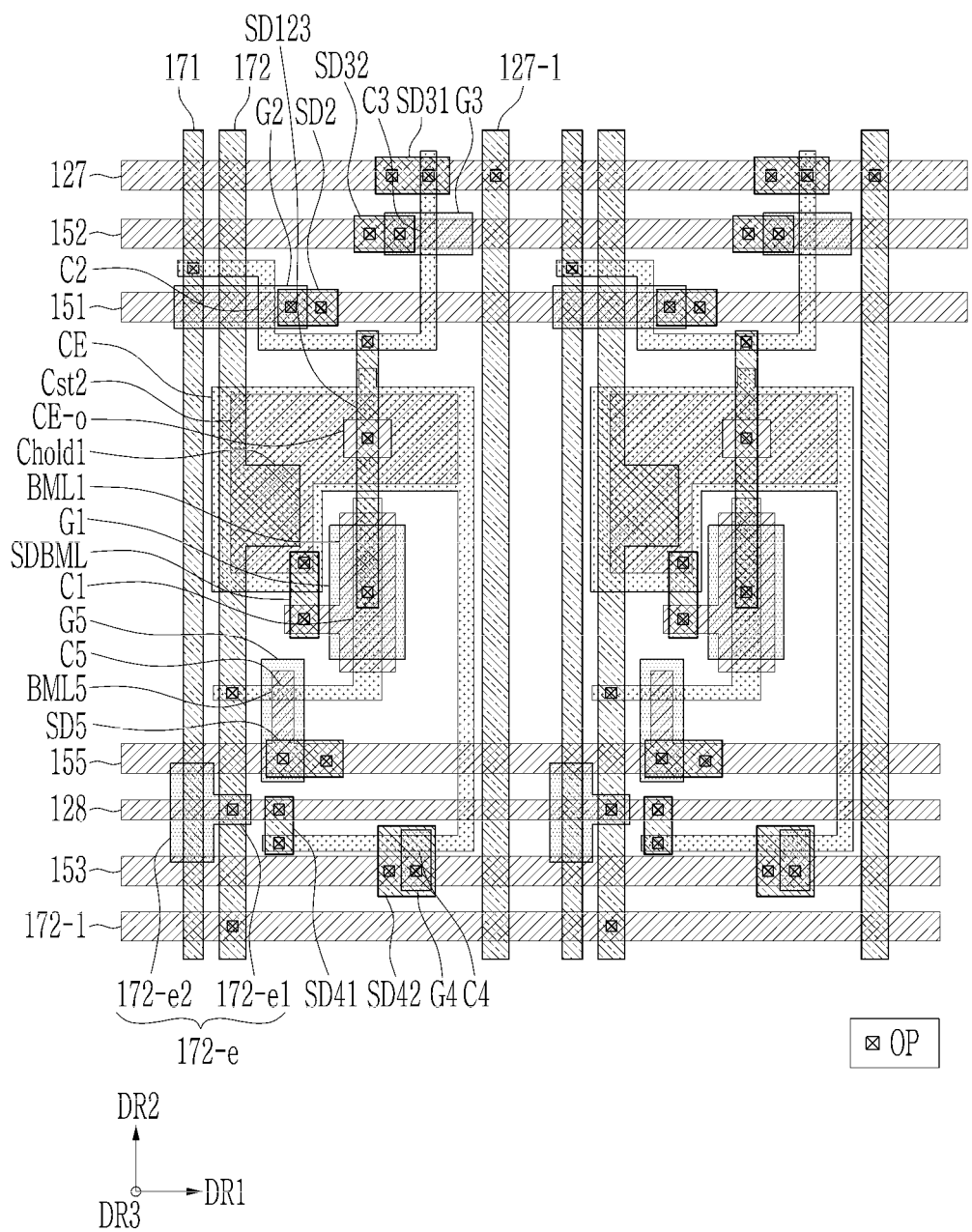

Referring to FIG. 19, a third conductive layer is formed on the third insulating layer 161, and the third conductive layer includes the data line 171, the driving voltage line 172, and the additional reference voltage line 127-1 extending in the second direction DR2, and additionally includes a plurality of connecting members SD123, SD31, SD32, SD2, SDBML, SD5, SD41, and SD42 each having an island-like structure.

The data line 171 is connected to the second semiconductor C2 through the opening OP to transfer the data voltage Vdata to the second semiconductor C2.

The driving voltage line 172 is connected to the fifth semiconductor C5 through an opening OP to transfer the driving voltage ELVDD to the fifth semiconductor C5, is connected to the connection portion 172-e1 of the shielding electrode 172e through another opening OP, and transfers the driving voltage ELVDD to the entire overlapping portion 172-e2 and the shielding electrode 172e.

Meanwhile, the driving voltage line 172 includes a first electrode Chold1 of the hold capacitor Chold, which is a protrusion that protrudes in the first direction DR1. The first electrode Chold1 of the hold capacitor Chold, which is the protrusion of the driving voltage line 172, overlaps the capacitor electrode CE in a plan view, and constitutes the hold capacitor Chold together with the capacitor electrode CE. In this case, the capacitor electrode CE may serve as the second electrode of the hold capacitor Chold.

In addition, the driving voltage line 172 is connected to the additional driving voltage line 172-1 through another opening OP. The driving voltage ELVDD is transferred in the first direction DR1 through the additional driving voltage line 172-1, and is transferred in the second direction DR2 through the driving voltage line 172, and thus the driving voltage ELVDD should not be different depending on a position.

The additional reference voltage line 127-1 is connected to the reference voltage line 127 through the opening OP, and the reference voltage Vref is transferred in the first direction DR1 through the reference voltage line 127, and is transmitted in the second direction DR2 through the additional reference voltage line 127-1 to prevent the reference voltage Vref from being different depending on a position.

The connecting member SD123 extends in the second direction DR2, and a first end thereof is connected to the semiconductor layer positioned between the second semiconductor C2 and the third semiconductor C3 through an opening OP, is connected to the second storage electrode Cst2 through another opening OP, and is connected to the first gate electrode G1 (driving gate electrode) through another opening OP. When the connecting member SD123 is connected to the second storage electrode Cst2, it is connected to the second storage electrode Cst2 through the opening CE-o of the capacitor electrode CE.

A connecting member SDBML extends in the second direction DR2, and has one end that is connected to the capacitor electrode CE through an opening OP and connected to the overlapping electrode BML1 through another opening OP.

A connecting member SD2 extends in the first direction DR1, and has one end that is connected to the second gate electrode G2 through an opening OP and connected to the first scan line 151 through another opening OP.

A connecting member SD31 extends in the first direction DR1, and has one end that is connected to the third semiconductor C3 through an opening OP and connected to the reference voltage line 127 through the other opening OP.

A connecting member SD32 extends in the first direction DR1, and has one end that is connected to the third gate electrode G3 through an opening OP and connected to the second scan line 152 through another opening OP.

A connecting member SD41 extends in the second direction DR2, and has one end that is connected to the fourth semiconductor C4 through an opening OP and connected to the initialization voltage line 128 through the other opening OP.

A connecting member SD42 has one end that is connected to the fourth gate electrode G4 through an opening OP and connected to the first control line 153 through another opening OP.

A connecting member SD5 extends in the first direction DR1, and has one end that is connected to the fifth gate electrode G5 through an opening OP and connected to the emission control line 155 through another opening OP.

The third conductive layer may include a metal such as copper (Cu), molybdenum (Mo), aluminum (Al), titanium (Ti), or a metal alloy thereof, and may be configured as a single layer or multiple layers.

Referring to FIG. 21, although a structure above the third conductive layer is not illustrated, an organic layer may be positioned on the third conductive layer, and one electrode (anode) of the light emitting diode LED may be positioned on the organic layer. One electrode (anode) of the light emitting diode LED is electrically connected to the capacitor electrode CE to receive an output current of the driving transistor T1. A structure of one electrode (anode) of the light emitting diode LED may vary, a pixel defining layer having an opening exposing a portion of an electrode (anode) of a light emitting diode LED, a light emitting layer positioned within the opening, another electrode (cathode) of the light emitting diode LED positioned on the pixel defining layer and the light emitting layer may be further included, and an encapsulation layer may be positioned thereon. Herein, the encapsulation layer includes at least one inorganic layer and at least one organic layer, and may have a triple-layer structure including a first inorganic encapsulation layer, an organic encapsulation layer, and a second inorganic encapsulation layer according to some embodiments. The encapsulation layer may be for protecting the emission layer from moisture or oxygen that may be introduced from the outside. According to some embodiments, the encapsulation layer may include a structure in which an inorganic layer and an organic layer are further sequentially stacked.

In addition, a configuration enabling touch sensing on the encapsulation layer may be further included according to some embodiments, and a configuration such as a light blocking member or a color filter may be further included according to some embodiments. According to some embodiments, a color conversion layer including quantum dots or a reflection control layer may be included instead of a color filter.

Figure 20:
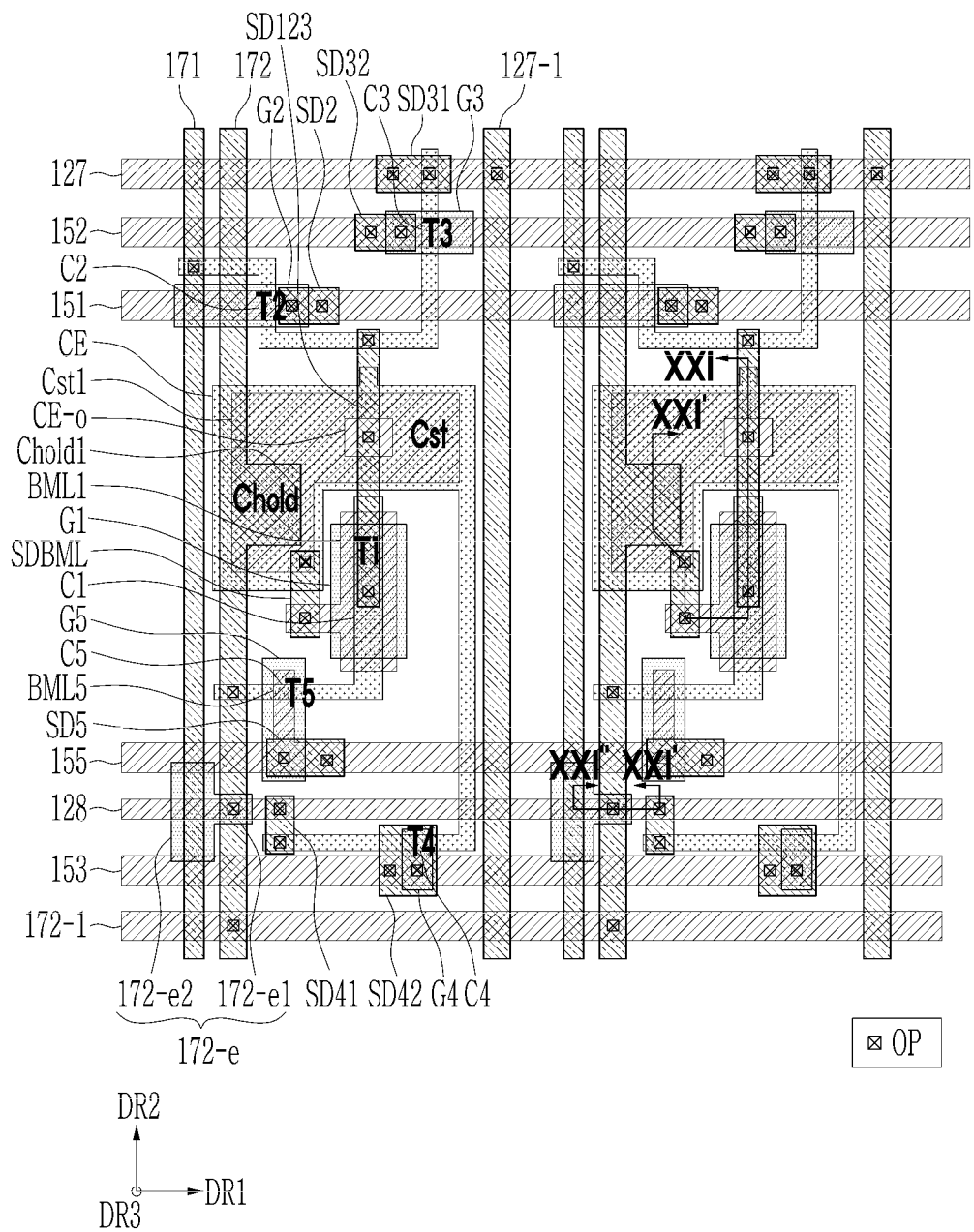

Referring to FIG. 20, positions of each of the transistors T1, T2, T3, T4, and T5 and positions of the storage capacitor Cst and the holding capacitor Chold are clearly illustrated in order to more easily grasp the plan view of FIG. 19.

In addition, cross-sectional lines XXI-XXI' and XXI'-XXI" are also illustrated in FIG. 20, and hereinafter, a cross-sectional structure along the cross-sectional lines XXI-XXI' and XXI'-XXI" of FIG. 20 will be described in more detail with reference to FIG. 21.

FIG. 21 illustrates a cross-sectional view of an emissive display device taken along cross-sectional lines XXI-XXI' and XXI'-XXI" of FIG. 20.

Referring to FIG. 21, the second storage electrode Cst2, the overlapping electrode BML1, and the initialization voltage line 128 included in the first conductive layer are formed on the substrate 110.

The first insulating layer 141 is covered on the first conductive layer, a semiconductor layer is positioned on the first insulating layer 141, and in FIG. 21, the capacitor electrode CE and the first semiconductor C1 included in the semiconductor layer are formed.

The second insulating layer 142 is covered on the semiconductor layer, and the first gate electrode G1 (driving gate electrode) and the shielding electrode 172e included in the second conductive layer are provided on the second insulating layer 142.

The third insulating layer 161 is covered on the second conductive layer, and openings OP are positioned in at least portions of the third insulating layer 161, the second insulating layer 142, and the first insulating layer 141.

The opening OP positioned on the third insulating layer 161 exposes the connecting portions 172-e1 of the first gate electrode G1 (driving gate electrode) and the shielding electrode 172e. The opening OP positioned on the third insulating layer 161 and the second insulating layer 142 exposes the capacitor electrode CE. In addition, the opening OP positioned on the third insulating layer 161, the second insulating layer 142, and the first insulating layer 141 exposes the second storage electrode Cst2, the overlapping electrode BML1, and the initialization voltage line 128.

The data line 171, the connecting members SD123, SDBML, and SD41, the driving voltage line 172, and the first electrode Chold1 of the hold capacitor Chold, which is a protrusion of the driving voltage line 172, included in the third conductive layer, are illustrated on the third insulating layer 161.

In FIG. 21, the connection member SD123 is connected to the second storage electrode Cst2 through an opening OP, and is connected to the first gate electrode G1 (driving gate electrode) through another opening OP.

A connecting member SDBML is connected to the capacitor electrode CE through an opening OP and connected to the overlapping electrode BML1 through another opening OP.

The connecting member SD41 is connected to the initialization voltage line 128 through the opening OP.

The driving voltage line 172 is connected to the connecting portion 172-e1 of the shielding electrode 172e through the opening OP, and transfers the driving voltage ELVDD to the overlapping portion 172-e2 and the entire shielding electrode 172e. Meanwhile, the first electrode Chold1 of the hold capacitor Chold, which is the protrusion of the driving voltage line 172, overlaps the capacitor electrode CE, and constitutes the hold capacitor Chold together with the capacitor electrode CE.

The data line 171 overlaps the overlapping portions 172-e2 of the shielding electrode 172e, and the shielding electrode 172e is positioned between the data line 171 and the initialization voltage line 128 to shield between the data line 171 and the initialization voltage line 128 so as to reduce the coupling capacitance. As a result, even when the data voltage Vdata flowing through the data line 171 is changed, the initialization voltage VINT flowing through the initialization voltage line 128 is not affected by the shielding electrode 172e to which the driving voltage ELVDD is applied. As a result, because a voltage of a portion initialized by the initialization voltage VINT in each pixel does not change, there is no problem in display quality.

According to some embodiments, only one opening OP is formed so that components are electrically connected to each other. However, according to some embodiments, the components may be electrically connected to each other by using two openings OP1 and OP2 as in the embodiments shown with respect to FIG. 3 to FIG. 10. In this case, some connecting members may be removed from the third conductive layer.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and their equivalents.

DESCRIPTION OF SOME OF THE REFERENCE SYMBOLS

| | |
|---|---|
| T1, T2, T3, T4, T5, T6, T7, T8, T9: transistor | |
| LED: light emitting diode | Cst: storage capacitor |
| Chold: hold capacitor | 127: reference voltage line |
| 128: initialization voltage line | 129: overlapping electrode voltage line |
| 151: first scan line | 152: second scan line |
| 153: first control line | 155: emission control line |
| 157: second control line | 171: data line |
| 172: driving voltage line | 127-1: additional reference voltage line |
| 172-1: additional driving voltage line | |
| 155-1: additional control line | CE: capacitor electrode |
| Cst1: first storage electrode | Cst2: second storage electrode |
| Chold1: first electrode of hold capacitor | |
| Cst1-o, CE-o: opening | 172e: shielding electrode |
| 172-e1: connecting portion | 172-e2: overlapping portion |
| BML1: overlapping electrode | BML5: additional overlapping electrode |
| C1, C2, C3, C4, C5, C6, C7, C8, C9: semiconductor | |
| G1, G2, G3, G4, G5, G79; gate electrode | |
| 110: substrate | 141: first insulating layer |
| 142: second insulating layer | 161: third insulating layer |
| OP, OP1, OP2: opening | |
| SD14, SD89, SD4, SD7, SD9, SD123, SD31, SD32, SD2, SDBML, SD5, SD41, SD42: connecting member | |

What is claimed is:

1. An emissive display device comprising:
a light emitting diode comprising an anode;
an n-type driving transistor comprising a first driving gate electrode, a first electrode configured to receive a driving voltage, a second electrode configured to transfer an output current to the anode, and a second driving gate electrode;
a second transistor comprising a first electrode connected to a data line;
a third transistor configured to connect the first electrode of the driving transistor and the first driving gate electrode of the driving transistor;
a storage capacitor comprising a first storage electrode and a second storage electrode connected to the first driving gate electrode;
a ninth transistor configured to transfer an overlapping electrode voltage to the second driving gate electrode;
an overlapping electrode voltage line configured to cross the data line in a plan view and to receive the overlapping electrode voltage; and
a shielding electrode at an intersection of the data line and the overlapping electrode voltage line and positioned between the data line and the overlapping electrode voltage line in a cross-sectional view.

2. The emissive display device of claim 1, further comprising:
a fifth transistor configured to transfer the driving voltage to the first electrode of the driving transistor; and
a sixth transistor configured to connect the second electrode and the anode of the driving transistor.

3. The emissive display device of claim 2, further comprising
a seventh transistor configured to transfer an initialization voltage to the first storage electrode and the anode.

4. The emissive display device of claim 3, further comprising
an initialization voltage line configured to cross the data line in a plan view and to receive the initialization voltage,
wherein the shielding electrode overlaps a portion where the data line and the initialization voltage line intersect, and the shielding electrode is between the data line and the initialization voltage line in a cross-sectional view.

5. The emissive display device of claim 4, further comprising an eighth transistor configured to connect the anode and the second driving gate electrode.

6. The emissive display device of claim 5, wherein the fifth transistor, the sixth transistor, and the eighth transistor are controlled by a same emission signal.

7. The emissive display device of claim 1, further comprising a fourth transistor configured to transfer a reference voltage to the first driving gate electrode.

8. The emissive display device of claim 1, wherein the shielding electrode is configured to receive the driving voltage.

9. An emissive display device comprising:
a light emitting diode comprising an anode;
an n-type driving transistor comprising a first driving gate electrode, a first electrode configured to receive a driving voltage, a second electrode configured to transfer an output current to the anode, and a second driving gate electrode;
a second transistor comprising a first electrode connected to a data line;
a third transistor configured to connect the first electrode of the driving transistor and the first driving gate electrode of the driving transistor;
a storage capacitor comprising a first storage electrode and a second storage electrode connected to the first driving gate electrode;
a seventh transistor configured to transfer an initialization voltage to the first storage electrode;
a ninth transistor configured to transfer an overlapping electrode voltage to the second driving gate electrode;
an initialization voltage line configured to cross the data line in a plan view and to receive the initialization voltage; and
a shielding electrode at an intersection of the data line and the initialization voltage line and between the data line and the initialization voltage line in a cross-sectional view.

10. The emissive display device of claim 9, further comprising:
a fifth transistor configured to transfer the driving voltage to the first electrode of the driving transistor; and
a sixth transistor configured to connect the second electrode and the anode of the driving transistor.

11. The emissive display device of claim 10, further comprising
an eighth transistor configured to connect the anode and the second driving gate electrode, wherein the fifth transistor, the sixth transistor, and the eighth transistor are controlled by a same emission signal.

12. The emissive display device of claim 9, further comprising a fourth transistor configured to transfer a reference voltage to the first driving gate electrode.

13. The emissive display device of claim 9, wherein the shielding electrode is configured to receive the driving voltage.

14. An emissive display device comprising:
a light emitting diode comprising an anode;
an n-type driving transistor comprising a first driving gate electrode, a first electrode configured to receive a driving voltage, a second electrode configured to transfer an output current to the anode, and a second driving gate electrode;
a second transistor comprising a first electrode connected to a data line;
a storage capacitor comprising a first storage electrode and a second storage electrode connected to the first driving gate electrode;
a hold capacitor comprising a first electrode configured to receive the driving voltage and a second electrode connected to the second driving gate electrode;
a fourth transistor configured to transfer an initialization voltage to the first storage electrode, the anode, the second driving gate electrode, and the second electrode of the hold capacitor;
an initialization voltage line configured to cross the data line in a plan view and to receive the initialization voltage; and
a shielding electrode at an intersection of the data line and the initialization voltage line and between the data line and the initialization voltage line in a cross-sectional view.

15. The emissive display device of claim 14, wherein the shielding electrode is configured to receive the driving voltage.

16. The emissive display device of claim 14, further comprising
a driving voltage line configured to transfer the driving voltage,
wherein the driving voltage line includes a protruding portion, and the protruding portion operates as a first electrode of the hold capacitor.

17. The emissive display device of claim 16, further comprising
a capacitor electrode below the first electrode of the hold capacitor,
wherein the capacitor electrode operates as a second electrode of the hold capacitor and the first storage electrode.

18. The emissive display device of claim 17, wherein
the second storage electrode overlaps the capacitor electrode in a plan view, and is under the capacitor electrode.

19. The emissive display device of claim 14, further comprising
a third transistor configured to transfer a reference voltage to the first driving gate electrode and the second storage electrode.

20. The emissive display device of claim 14, further comprising
a fifth transistor configured to transfer the driving voltage to the first electrode of the driving transistor.

* * * * *